United States Patent
Hiramatsu et al.

(10) Patent No.: US 8,217,335 B2
(45) Date of Patent: Jul. 10, 2012

(54) OPTICAL MODULATION-TYPE DETECTION DEVICE AND ELECTRONIC DEVICE

(75) Inventors: Takuma Hiramatsu, Osaka (JP); Ryohhei Tada, Osaka (JP); Isamu Kawabe, Osaka (JP); Naruichi Yokogawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 541 days.

(21) Appl. No.: 12/548,543

(22) Filed: Aug. 27, 2009

(65) Prior Publication Data
US 2010/0067017 A1    Mar. 18, 2010

(30) Foreign Application Priority Data
Sep. 18, 2008  (JP) .................................. 2008-239833

(51) Int. Cl.
*G01N 21/55*    (2006.01)
(52) U.S. Cl. ........................................ 250/221; 250/205
(58) Field of Classification Search .................. 250/221, 250/205; 340/555, 556
See application file for complete search history.

(56) References Cited

U.S. PATENT DOCUMENTS
5,280,162 A    1/1994  Marwin
2006/0108514 A1    5/2006  Maruyama FOREIGN PATENT DOCUMENTS
| JP | 60-177282 A | 9/1985 |
|---|---|---|
| JP | 62-116286 A | 5/1987 |
| JP | 6-18983 U | 3/1994 |
| JP | 2001-221859 A | 8/2001 |
| JP | 2006-145483 A | 6/2006 |
| KR | 10-1994-0015925 A | 7/1994 |

*Primary Examiner* — Tony Ko
(74) *Attorney, Agent, or Firm* — Birch, Stewart, Kolasch & Birch, LLP

(57) ABSTRACT

An optical modulation-type detection device has a noise detection mode having (i) an offset canceling (hereinafter referred to as "OC") period in which (a) the light-reception signal pathway of a pulse signal converting section is cut off so that an offset of the pulse signal converting section is suppressed and (b) the light-reception signal pathway of the pulse signal converting section is reconnected while a state in which the offset is suppressed is being maintained, at an end of the OC period, and (ii) an asynchronous reception period in which whether or not asynchronous reception occurs is detected after the first period, and an object detection mode having a synchronous reception period in which whether or not synchronous reception occurs is detected after the asynchronous reception is not detected in the noise detection mode.

38 Claims, 11 Drawing Sheets

OPTICAL MODULATION-TYPE DETECTION DEVICE AND ELECTRONIC DEVICE

This Nonprovisional application claims priority under 35 U.S.C. §119(a) on Patent Application No. 2008-239833 filed in Japan on Sep. 18, 2008, the entire contents of which are hereby incorporated by reference.

TECHNICAL FIELD

The present invention relates to an optical modulation-type detection device that is an object detection device which utilizes light. The present invention especially relates to (i) an optical modulation-type detection device which allows reductions in size and power consumption and which has high sensitivity, so as to be mounted in a portable device such as a portable phone, and (ii) an electronic device including the optical modulation-type detection device.

BACKGROUND ART

Conventionally, a detection device has been known which projects pulsed light and detects light reflected from an object, so as to detect presence or absence of the object. Such a detection device is, for example, used in an automatic door, an automatic washing apparatus for a sanitary fixture, or amusement equipment. Such a detection device is, for example, disclosed in Patent Literature 1 (Japanese Unexamined Utility Model Application Publication, Jitsukai, No. 6-18983 (Publication Date: Mar. 14, 1994)) and Patent Literature 2 (Japanese Patent Application Publication, Tokukai, No. 2006-145483 A (Publication Date: Jun. 8, 2006)).

Meanwhile, a new type of portable device has appeared in which a sensor (hereinafter referred to as "proximity sensor") detecting presence or absence of an object in proximity is provided in a portable device, such as a portable phone or a media player, which has progressed in multifunction and in reduction in size or reduction in thickness. Such a new type of portable device is used for the following purposes.

(1) On/off control of a backlight for a display screen of a portable device having a telephone function and the display screen. The backlight for the display screen is turned off, for example, when a proximity state in which human skin comes close to the portable device is detected during a call. The backlight is turned on again when a change from the proximity state to a non-proximity state is detected. This allows a reduction in power consumption of an entire system.

(2) On/off control of a touch panel function of a portable device having telephone function and touch panel function. The touch panel function is turned off, for example, during a call or while the device is put into a pocket. This allows prevention of malfunction of a system.

(3) A touchless switch of a portable device which has a wireless communication function. For example, a device such as a wireless mouse, a wireless keyboard, or a controller of a game machine is turned on while an operator put his hand or finger close to the device, and the device is put into a sleep mode while the operator put his hand or finger away from the device. This allows a reduction in power consumption of the device.

It is strongly desired that a proximity sensor, used as the applications of the portable device like above, (i) has higher resistance to external disturbance light such as sunlight and fluorescent light than conventional optical sensor technologies, (ii) realizes, with an extremely small mounting area, sensing properties such as desired detection sensitivity and response time, and (iii) has extremely low power consumption.

In order to reduce size of such a detection device without sacrificing detection sensitivity, it is necessary (i) to reduce size and improve sensitivity of a light-receiving section and a light-receiving element and (ii) to realize high sensitivity of an amplifier circuit for a light-reception signal or to realize an increase in light amount of a light-emitting element. However, this causes an increase in power consumption of the amplifier circuit or a light-emitting element driving circuit. In addition, this causes an increase in optical or electrical crosstalk between the light receiving section and a light-emitting section and/or a reduction in resistance to external disturbance light, thereby resulting in that a malfunction is likely to occur.

Moreover, in a case where any of the detection methods disclosed in the respective Patent Literatures is applied to such a detection device having a small size and low power consumption, the following problems are caused: (i) it is difficult to realize a compact modular proximity sensor or a compact monolithic proximity sensor, (ii) a problematic response occurs which is not suitable for a sensor, and (iii) a situation often occurs which is incompatible with or conflicts with the techniques required for suppressing noise and offset so that analog characteristics such as desired detection sensitivity are realized as an actual sensor circuit.

For example, the Patent Literature 1 discloses an object detection device which, in a case where it receives the light during a non-light-emission period of a light-emitting section, suspends its process, until it ceases to receive light, so as to improve the resistance to external disturbance light. FIG. 10 shows a flowchart of this process. Specifically, a light-receiving circuit is activated once every 0.7 seconds, and the object detection device waits, for 5 ms after a start of operation, for external disturbance light to disappear. Thereafter, the object detection device causes the light-emitting section to emit light, and observes presence or absence of corresponding reflection light. If the external disturbance light exists more than 5 ms, it is assumed that it is not possible to observe any object and that no reflecting object is present, and the object detection device waits for the next activation of the light-receiving circuit.

This algorithm causes the following problems.

First, influence of noise contributing factors (e.g. temperature drift of a circuit, and power supply noise) other than the external disturbance light is enormous since external disturbance light is observed during an entire period no light is emitted. Moreover, sampling of a state is carried out at long intervals of 0.7 seconds. Accordingly, in a case where a time period the external disturbance light is sufficiently attenuated is short, or in a case where intensity of the external disturbance light fluctuates so as to have some cycle, then reflection light can be observed only at the timing which is accidentally coincident with the beat cycle. Consequently, the object detection device has a low probability of carrying out object detection operation. Therefore, the object detection device of the Patent Literature 1 cannot meet response and accuracy required for functioning as a proximity sensor such as that tracks successive human movements, which is an object to be detected by the present invention. Moreover, the reflection light is observed to the extent that the number or level of the received pulses with respect to a light-emission pulse pattern is merely counted or sensed, respectively. As such, it is not possible to obtain judgment information required for carrying out a more precise time-axis control with respect to the operation of the detection device. Thus, the object detection device of the Patent Literature 1 has no element which allows precise searching of the timing so that the reflection light can be surely observed under the environment where external disturbance light exists, and therefore has extremely low observation accuracy in view of the time-axis.

Next, according to the technique disclosed in the Patent Literature 2, a pattern of light-emission pulse is designed so that the resistance to external disturbance light is improved (see FIG. 11). Specifically, light emission is repeated more than once at a cycle which is twice as large as light emission pulse width, and a main frequency component of signal light is set to be higher than a frequency component of the external disturbance light. In FIG. 11, the light emission is repeated twice. In view of its purpose, however, this gives rise to a necessity of extending, more than necessary, the bandwidth of transmitting circuit and receiving circuit toward the high frequency band. This causes a detection circuit to detect even noise components of high frequencies, thereby making it difficult to attain high sensitivity. In an algorithm such as that is shown in FIG. 11, a detected output is updated too often, so that chattering of the detected output is caused. Therefore, the technique disclosed in the Patent Literature 2 cannot have sufficient response characteristics as a proximity sensor for tracking successive human movements, which is an object to be detected by the present invention.

Moreover, in a case where high integration, in which analog and digital elements are mixed, is intended by use of a fine CMOS process so as to realize a compact detection device, an offset voltage generated in the integrated circuit due to variations in the elements of the integrated circuit becomes a principal factor which causes a large deterioration in sensitivity of the detection device.

SUMMARY OF INVENTION

An object of the present invention is to provide an optical modulation-type detection device which allows (i) a reduction in power consumption without causing a deterioration in detection sensitivity and response characteristics and (ii) a reduction in size without increasing a circuit size.

In order to attain the above object, an optical modulation-type detection device of the present invention in which pulsed light is emitted from a light-emitting element toward an object to be detected, light which is reflected from or transmits through the object is received by a light-receiving element, and presence or absence of an object is detected in accordance with a light-reception signal supplied from the light-receiving element, said device includes: a pulse signal converting section which converts the light-reception signal into a pulse signal, and cuts off a light-reception signal pathway so as to suppress an offset of the pulse signal converting section; and a detection section which detects in accordance with the pulse signal (i) whether or not a first state occurs in which the light-reception signal is present during a period in which the pulsed light is not being emitted and (ii) whether or not a second state occurs in which the light-reception signal is present during a period in which the pulsed light is being emitted, the optical modulation-type detection device having operation modes including: a first operation mode having (i) a first period in which (a) the light-reception signal pathway of the pulse signal converting section is cut off so that the offset of the pulse signal converting section is suppressed and (b) the light-reception signal pathway of the pulse signal converting section is reconnected while a state in which the offset is suppressed is being maintained, at an end of the first period, and (ii) a second period in which whether or not the first state occurs is detected after the first period, and a second operation mode having at least a third period in which whether or not the second state occurs is detected after the first period is not detected in the first operation mode.

As described above, in a case where high integration, in which analog and digital elements are mixed, is intended by use of a fine CMOS process so as to realize a compact detection device, an offset voltage generated in the integrated circuit due to variations in the elements of the integrated circuit becomes a principal factor which causes a large deterioration in sensitivity of the detection device. However, an arrangement for suppressing the offset voltage is generally a stationary state (full-time connection), and therefore requires a large phase compensation capacity, thereby causing a large circuit size.

In contrast, the optical modulation-type detection device of the present invention causes the pulse signal converting section to cut off a pathway for amplifying a light-reception signal, thereby making it possible to correctly carry out offset canceling of a circuit itself under any external disturbance light circumstances. Further, a point at which the pathway is cut off is biased to be low impedance. This makes it possible to stably perform signal amplification without generating an excessive transient voltage in a case where the pathway for amplifying the signal is reconnected and returns to normal state after the offset canceling period is completed.

The arrangement eliminates the need for an arrangement in which offset canceling is continuously carried out so that a large phase compensation capacity is required, and makes it possible to drive the light-emitting element after searching a state in which no influence of external disturbance light exists while continuously suppressing an offset of the pulse signal converting section. This makes it possible to detect presence or absence of an object in a high-sensitivity state. As such, it is possible to improve sensitivity and prevent malfunction of the optical modulation-type detection device without causing an increase in circuit size and bias current.

It is thus possible (i) to realize a reduction in power consumption without sacrificing detection sensitivity and response characteristics required for a detection device, and (ii) to realize a reduction in size of the device without increasing a circuit size.

In order to attain the object of the present invention, an electronic device of the present invention includes the optical modulation-type detection device.

According to the arrangement, the electronic device of the present invention includes the optical modulation-type detection device which causes (i) a reduction in power consumption without sacrificing detection sensitivity and response characteristics and (ii) a reduction in size without increasing a circuit size, thereby resulting in a reduction in mounting area. Therefore, in a case where functions of a plurality of object detection sensors having respective different specifications are integrated with each other or a function of an object detection sensor is integrated with a function of a different sensor such as illuminance sensor or RGB sensor, so as to be modularized as a single detection device, it is possible to realize provision of such a single detection device in a portable apparatus.

For a fuller understanding of the nature and advantages of the invention, reference should be made to the ensuing detailed description taken in conjunction with the accompanying drawings.

DESCRIPTION OF EMBODIMENTS

An embodiment of the present invention is described below with reference to FIGS. 1 through 9.

Figure 1A:
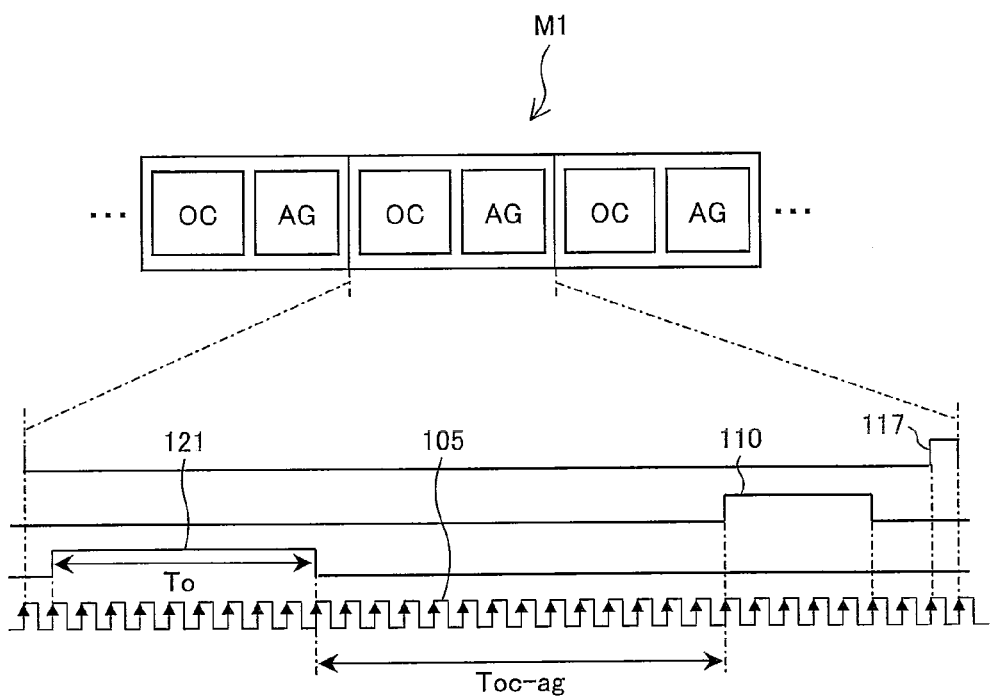
FIG. 1 is a view showing how main operation modes are carried out by an optical modulation-type detection device of the present embodiment, and is a timing chart of signals indicative of how the operation modes work, FIG. 1 (a) shows a noise detection mode, and FIG. 1 (b) shows an object detection mode.

FIG. 1 is a view showing how main operation modes are carried out by an optical modulation-type detection device 150 of the present embodiment (upper part of FIG. 1), and is also a timing chart of signals indicating how the operation modes work (lower part of FIG. 1). FIG. 1 (a) shows a noise detection mode (first operation mode) M1, and FIG. 1 (b) shows an object detection mode (second operation mode) M2. FIG. 2 is a block diagram showing an arrangement of substantial parts of the optical modulation-type detection device 150. First, the arrangement of the substantial parts of the optical modulation-type detection device 150 is described with reference to FIG. 2.

(Arrangement of Substantial Parts of Optical Modulation-Type Detection Device)

The optical modulation-type detection device 150 is an object detection device which detects presence or absence of an object with the use of light. As shown in FIG. 2, the optical modulation-type detection device 150 includes a light-emitting element 100, a light-receiving element 103, a clock signal generating section 106, a pulse signal generating section 108, a light-emitting element driving section 109, a pulse signal reproducing section (pulse signal converting section) 112, latch sections (detection sections) 114 and 116, a judging section 118, and an external output section 119.

The light-emitting element 100 is driven by the light-emitting element driving section 109 in response to a pulse signal (first pulse signal) 107 (later described) so as to emit light toward a region in which an object to be detected (hereinafter also referred to as "reflecting object") passes. For example, pulse light 101 generated in 1 (one) clock cycle has a pulse width of 8 µs, provided that a clock signal 105 (later described) has a frequency of 125 kHz.

The light emitted from the light-emitting element 100 is directed toward an object to be detected, is reflected from the object to be detected, and is then received by the light-receiving section 103. The light-receiving section 103 converts the light thus reflected (reflection light 102: in some applications, transmission light which transmitted through an object to be detected) into an electric signal (light-receiving current, light-reception signal 104). In the present embodiment, the light-receiving element 103 is realized by photodiodes. Note that the light-reception signal 104 is generated not only by the reflection light 102, but also by light such as external disturbance noise light.

The clock signal generating section 106 generates a clock signal 105, and supplies the clock signal 105 thus generated to the pulse signal generating section 108 and the judging section 118. A frequency of the clock signal 105 can be determined in view of (i) S/N of the pulse signal reproducing section 112 and (ii) response time required for functioning as a detection device. Alternatively, instead of using the clock signal generating section 106, another arrangement is possible in which a clock signal supplied externally is subjected to buffering, and is then supplied to each section.

The pulse signal generating section 108 generates pulse signals 107, 110 (third pulse signal), 117 (fourth pulse signal), and 121 (second pulse signal) in response to the clock signal 105 supplied from the clock signal generating section 106. The pulse signal generating section 108 supplies the pulse signal 107 to a NAND circuit 114a (later described), the judging section 118, and the light-emitting element driving section 109, supplies the pulse signal 110 to a NAND circuit 116a (later described), supplies the pulse signal 117 to RS flip-flops 114b and 116b (later described), and supplies the pulse signal 121 to the pulse signal reproducing section 112. Note that the pulse signals 107, 110, 117, and 121 are not activated at the same time.

In addition, the pulse signal generating section 108 counts a first cycle T1 which determines how long the noise detection mode M1 and the object detection mode M2 are. In view of this, it is advantageous that the pulse signal generating section includes a counter which carries out counting operation in response to the clock signal 105 and has the largest number of bits. The pulse signal generating section 108 can be easily realized by an arrangement in which lower bits of the counter are used to generate the pulse signals 107, 110, 117, and 121 and all bits including higher bits of the counter are used to count the longest cycle.

The pulse signal reproducing section 112 reproduces the light-reception signal 104 supplied from the light-receiving element 103 as a reproduced pulse signal (pulse signal) 111 which is a voltage pulse signal having a logical level (converts the light-reception signal 104 into the reproduced pulse signal (pulse signal) 111). The pulse signal reproducing section 112 also carries out offset canceling in which an offset voltage generated in its circuit is suppressed. This will be described later in detail.

The latch section 114 is constituted by the NAND circuit 114a and the negative logic input RS flip-flop (RS-FF) 114b. Similarly, the latch section 116 is constituted by the NAND circuit 116a and the negative logic input RS flip-flop 116b.

The reproduced pulse signal 111 supplied from the pulse signal reproducing section 112 is supplied to each of the NAND circuits 114a and 116a. In addition, the pulse signal 107 serving as a synchronous gate signal is supplied to the NAND circuit 114a, and the pulse signal 110 serving as an asynchronous gate signal is supplied to the NAND circuit 116a. The NAND circuits 114a and 116a carry out logical product operation of the signals thus supplied. This makes it possible to judge (i) whether the light-reception signal 104 is present or not while the pulsed light 101 is being emitted (whether or not there is synchronous reception, the NAND circuit 114a, whether or not the current state is a second state) and (ii) whether the light-reception signal 104 is present or not while the pulse light 101 is not being emitted (whether or not there is asynchronous reception, the NAND circuit 116a, whether or not the current state is a first state). Specifically, in a case where the reproduced pulse signal 111 and the pulse signal 107 are present in the same period of time, it is determined that "synchronous reception is present", and in a case where the reproduced pulse signal 111 and the pulse signal 110 are present in the same period of time, it is determined that "asynchronous reception is present".

The pulse signal 117 serving as a reset signal is supplied to each of the RS flip-flops 114b and 116b. In addition, an output signal of the NAND circuit 114a is supplied to the RS flip-flop 114b, and an output signal of the NAND circuit 116a is supplied to the RS flip-flop 116b. The RS flip-flop 114b holds the output signal (judgment result) of the NAND circuit 114a until the RS flip-flop 114b is reset in response to the pulse signal 117. This causes a synchronous reception output signal 113 to be supplied to the judging section 118, the synchronous reception output signal 113 denoting the presence of the synchronous reception. The RS flip-flop 116b holds the output signal (judgment result) of the NAND circuit 116a until the RS flip-flop 116b is reset in response to the pulse signal 117. This causes an asynchronous reception output signal 115 to be supplied to the judging section 118, the asynchronous reception output signal 115 denoting the presence of the asynchronous reception.

The judging section 118 judges which of the noise detection mode M1 and the object detection mode M2 is to be selected, in response to the synchronous reception output signal 113 supplied from the latch section 114 and the asynchronous reception output signal 115 supplied from the latch section 116. In addition, at the end of the object detection mode M2, the judging section 118 judges whether an object to be detected is present or not, on the basis of whether the synchronous reception output signal 113 is present for a certain period of time. The judging section 118 supplies a judged result to the external output section 119.

The external output section 119 supplies outward, as an output signal 120, the judged result supplied from the judging section 118. The external output section 119 can simply output the judged result (digital value), via buffer.

Alternatively, the external output section 119 can hold/renew the judged result in a register, and then output the judged result in the register, via buffer, in response to external readout.

(Arrangement and Operation of Pulse Signal Reproducing Section)

Figure 3:
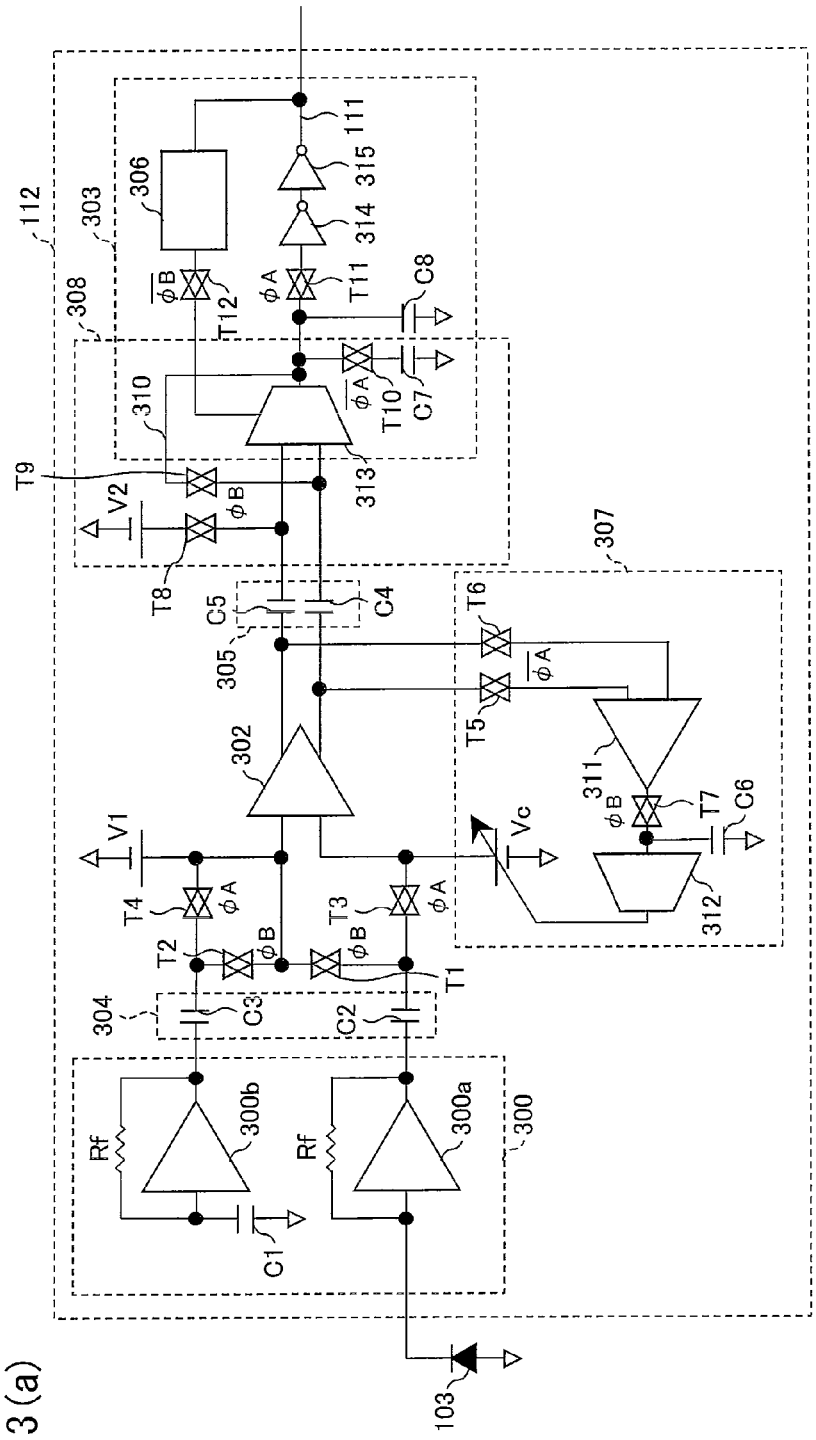
FIG. 3 (a) is a view showing an arrangement of a pulse signal reproducing section, and FIG. 3 (b) is a view showing an arrangement of a pulse signal serving as a gate signal in offset canceling operation of the pulse signal reproducing section.
Figure 3:
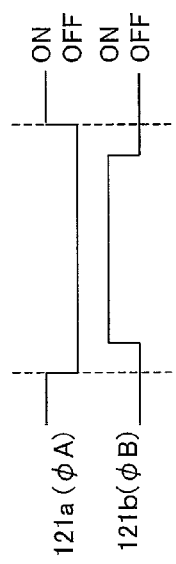

The following description deals with an arrangement of substantial parts of the pulse signal reproducing section 112 and an operation of the pulse signal reproducing section 112 with reference to FIG. 3. FIG. 3 (a) shows the arrangement of the substantial parts of the pulse signal reproducing section 112, and FIG. 3 (b) shows an arrangement of the pulse signal 121.

First explained is the arrangement of the pulse signal reproducing section 112. As shown in FIG. 3 (a), the pulse signal reproducing section 112 includes the following three main circuit blocks: (i) a current/voltage converting section 300, (ii) a differential input output main amplifier 302, (iii) a differential input comparison section 303 having a hysteresis control circuit 306. These circuit blocks are AC-coupled to one another via a first capacitance pair 304 and a second capacitance pair 305.

The current/voltage converting section 300 is connected to the light-receiving element 103, and includes (i) a current/voltage converting circuit 300a for carrying out current/voltage conversion with respect to the light-reception signal 104 supplied from the light-receiving element 103 and (ii) a dummy current/voltage converting circuit 300b for carrying out impedance-matching between the main amplifier 302 and the current/voltage converting section 300 so as to allow stable differential amplification of the main amplifier 302. The reference sign Rf represents a feedback resistor.

The first capacitance pair 304 includes capacitors C2 and C3, and the second capacitance pair 305 includes capacitors C4 and C5. The main amplifier 302 carries out differential amplification with respect to a voltage signal which is converted and supplied via the first capacitance pair 304 by the current/voltage converting circuit 300a.

A first offset canceling loop 307 and a second offset canceling loop 308 suppress an offset voltage generated in the pulse signal reproducing section 112. The first offset canceling loop 307 includes transmission gates T5 through T7, a differential input error amplifier 311, a capacitor C6, and an operational amplifier 312. The second offset canceling loop 308 includes transmission gates T8 through T10, an operational amplifier 313, and a capacitor C7.

The comparison section 303 converts a voltage signal subjected to differential amplification of the main amplifier 302 into a reproduced pulse signal 111. The comparison section 303 includes the hysteresis control circuit 306, transmission gates T10 through T12, an operational amplifier 313, capacitors C7 and C8, and inverters 314 and 315 (the comparison section 303 shares the transmission gate T10, the operational amplifier 313 and the capacitor C7 with the second offset canceling loop 308).

A pulse signal 121 is supplied to a control terminal of each of the transmission gates T1 through T12. The transmission gates T1 through T12 are arranged to turn on in a case where a signal of an H level (high, ON) is supplied to their respective control terminals. Two power sources V1 and V2 have different electric potentials in the present embodiment, but can have a single electric potential.

Each of the circuit blocks can be modified in various ways. Specifically, it is possible that each of the current/voltage converting section 300 and the dummy current/voltage converting section 301 includes a buffer output section such as a source follower. Moreover, in a case where the capacitance pair 304 is biased by the power source V1, via the transmission gates T1 and T2, during an offset canceling period, it is possible to provide a level shift circuit, which doubles with an impedance converter, between the power source V1 and respective of the transmission gates T1 and T2 so that a slew rate is improved, instead of an arrangement in which an electric potential is applied directly from T1 and T2. In FIG. 3, the offset canceling loop 307 controls Vc by use of a single-ended output. Alternatively, the offset canceling loop 307 can use a differential input and output configuration by which both V1 and Vc are varied so that another reference voltage is controlled. According to the configuration of FIG. 3, a hysteresis current is added to or subtracted from the output node of the operational amplifier 313 by the hysteresis control circuit 306 of the comparison section 303. In this regard, other modifications are possible. For example, it is possible that a source resistor is connected in series to each transistor of an input transistor pair of the operational amplifier 313 so that a voltage drop across the source resistor is controlled. This allows the operational amplifier 313 to have a hysteresis property. A hysteresis property can be obtained in a circuit which is followed by the comparison section 303.

In any case, according to the pulse signal reproducing section 112 of the present invention shown in FIG. 3, T3 and T4 allow cutoff of a pathway, extended beyond the capacitance pair 304, for amplifying the light-reception signal 104. This makes it possible to properly carry out offset canceling of a circuit itself under any external disturbance light circumstances. Moreover, in a case where a node by which the capacitance pair 304 is followed (a point at which the pathway is cut off) is biased to be a low impedance during an offset canceling period, the circuit which is followed by the capacitance pair 304 receives an output generated due to external disturbance light, external disturbance electromagnetic noise, and/or the like by the current/voltage converting circuit 300 or the dummy current/voltage converting circuit 301. This makes it possible to stably carry out signal amplification without generating an excessive transient voltage, when the pathway for amplifying the signal is reconnected and returns to a normal connecting state after the offset canceling period is completed.

The following description deals with how the pulse signal reproducing section 112 operates. The optical modulation-type detection device 150 has an offset canceling period OC, during which an offset of the pulse signal reproducing section 112 is suppressed, in at least one of the noise detection mode M1 and the reflecting object detection mode M2, which are main operation modes of the optical modulation-type detection device 150. This will be described later in detail.

During the offset canceling period OC, two types of pulse signals 121, i.e., a pulse signal 121a (also referred to as "φA") and a pulse signal 121b (also referred to as "(φB") are supplied to the pulse signal reproducing section 112. The pulse signal 121b has a polarity reverse to the pulse signal 121a, and has both edges which are within both edges of the pulse signal 121a (see FIG. 3 (b)). Whereas, during a period other than the offset canceling period OC, 1 (one) type of a pulse signal 121, i.e., a pulse signal 121 of an H level is supplied to the pulse signal reproducing section 112.

During the period other than the offset canceling period OC, the pulse signal reproducing section 112 causes the current/voltage converting circuit 300a to convert a light-reception signal 104 supplied from the light-receiving element 103 into a voltage signal, and causes the main amplifier 302 to carry out differential amplification of the voltage signal, and then causes the differential input comparison section 303 to convert the voltage signal into a reproduced pulse signal 111 of a logical level.

On the other hand, during the offset canceling period OC, the pulse signals 121a and 121b are supplied to the pulse signal reproducing section 112, as shown by "φA" and "φB" in FIG. 3 (a), respectively. The pulse signals 121a and 121b thus supplied cause a disoverlap, thereby allowing a reduction in influence of charge injection. Note that "–(bar) φA" and "–(bar) φB" indicate signals having polarities reverse to those of "φA" and "φB", i.e., signals having polarities reverse to those of the pulse signals 121a and 121b, respectively.

The pulse signals 121 thus supplied cause the transmission gates to cut off the signal pathway in the pulse signal reproducing section 112. This causes formations of (i) the first offset canceling loop 307 defined between the first capacitance pair 304 and an output of the main amplifier 302 and (ii) the second offset canceling loop 308 defined between the second capacitance pair 305 and an analog output node 310 of the comparison section 303. In the first offset canceling loop 307, the loop is driven by the error amplifier 311, and a cancelled result is stored in the capacitor C6, whereas, in the second offset canceling loop 308, the operational amplifier 313 itself is connected, so as to serve as a buffer, along with the capacitor C7 (phase compensation capacitance), and a cancelled result is stored in the second capacitance pair 305. Note that the hysteresis control circuit 306 stops outputting a hysteresis current during the offset canceling period, and causes the operational amplifier 313 completely to operate as an operational amplifier buffer. Note also that, during the offset canceling period, the hysteresis control circuit 306 causes a digital output section which supplies a reproduced pulse signal 111 to be reset to a state in which no light-reception signal is inputted.

As described above, while a pulse signal 121 is being active, a light-reception signal pathway is cut off, so that the offset canceling loops are closed (φA: ON→OFF, φB: OFF→ON). Next, offset inherent in a circuit is suppressed due to a corresponding loop gain, so that a cancelled result is stored in a capacitance (φB: ON→OFF). Subsequently, the light-reception signal pathway is reconnected so that a light-reception signal amplifying (period other than the offset canceling period OC) starts again (φA: OFF→ON).

(Operation of Optical Modulation-Type Detection Device)

Figure 4:
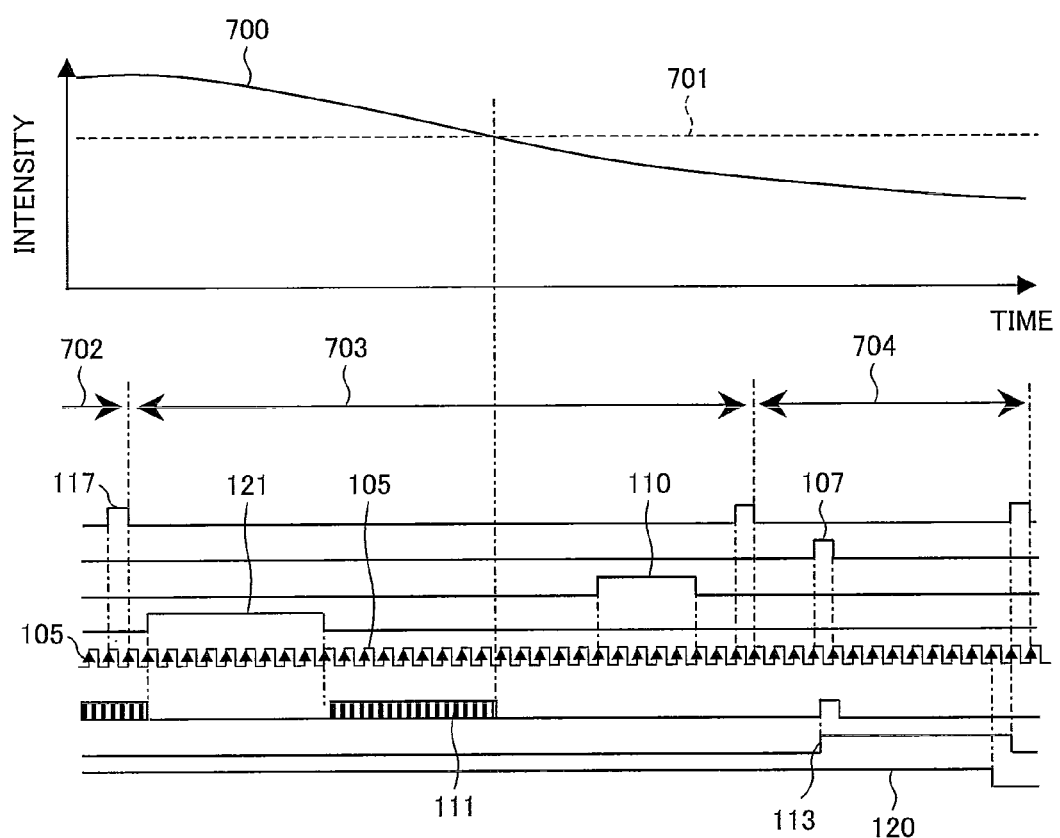
FIG. 4 is a view showing how the optical modulation-type detection device mainly operates, an upper part of FIG. 4 is a graph showing how an external disturbance light noise level (only an envelope curve is shown in FIG. 4) changes over time, a horizontal axis indicating intensity and a vertical axis indicating time, and a lower part of FIG. 4 is a timing chart of signals indicative of how the optical modulation-type detection device operates.

The following description deals with how the optical modulation-type detection device 150 operates with reference to FIGS. 1 and 4. FIG. 4 shows how the optical modulation-type detection device 150 mainly operates. An upper part of FIG. 4 is a graph showing how an external disturbance light noise level (only an envelope is shown in FIG. 4) changes with time, where a horizontal axis represents intensity and a vertical axis represents time. A lower part of FIG. 4 is a timing chart of signals indicating how the optical modulation-type detection device 150 operates. Note that the broken line indicated by the reference numeral 701 in the upper part of FIG. 4 represents a sensitivity limit level of the optical modulation-type detection device 150.

The optical modulation-type detection device 150 has, as operation modes, a start-up mode M0, a noise detection mode M1, a reflecting object detection mode M2, a suspending mode M3, and a continuous shutdown mode M4.

First explained is the start-up mode M0 (a period indicated by the reference numeral 702 in FIG. 4). In the start-up mode M0, when the optical modulation-type detection device 150 is turned on or activated from a shutdown state, a clock signal generating section 106 starts its operation and generates a clock signal 105. The pulse signal generating section 108 starts its operation in response to the clock signal 105 and supplies a pulse signal 117 to the RS flip-flops 114b and 116b. This causes the latch sections 114 and 116 to be reset, so that it is possible to prevent a control system from not carrying out a desired operation due to an indeterminate latch output. In response to the resetting of the latch sections 114 and 116, a result determined by the judging section 118 that no object is present is supplied outside, via the external output section 119. The start-up mode M0 ends with this operation, and then the optical modulation-type detection device 150 enters into the noise detection mode M1.

In a case where the optical modulation-type detection device 150 is used as a proximity sensor, initial value setting of an external output of the external output section 119 is especially important. Namely, when the optical modulation-type detection device 150 is turned on or activated from a shutdown state, a system in which the optical modulation-type detection device 150 is mounted always expects an external output indicative of "non-proximity". Even in a case where the optical modulation-type detection device 150 is activated in a state in which the optical modulation-type detection device is actually in proximity to a reflecting object, it is possible that a response of the sensor becomes more natural and appropriate when seen from the outside, by causing the external output section 119 to first supply an external output indicative of "non-proximity" and then to update and change the external output into an external output indicative of "proximity" in accordance with operation of the sensor.

The following description deals with the noise detection mode M1. As shown in FIG. 1 (a), according to the noise detection mode M1, each of (i) an offset canceling period OC for suppressing an offset of the pulse signal reproducing section 112 and (ii) an asynchronous reception period AG for detecting presence or absence of asynchronous reception after the offset canceling period OC is secured once every 32-clock cycle period, and the periods (i) and (ii) are alternately repeated so that an external disturbance light noise level is observed in a high-sensitivity state obtained immediately after the offset canceling becomes effective.

As described above, the asynchronous reception period AG is secured by supplying a pulse signal 110 to the latch section 116.

The offset canceling period OC includes a time period (hereinafter referred to as "period Toc") from the end of offset canceling which is carried out in response to a pulse signal 121 in the pulse signal reproducing section 112 to the convergence of a transient voltage which is generated when the pulse signal reproducing section 112 is returned to a normal operation state. A series of operations are carried out in the offset canceling period OC. A length of the offset canceling period OC is constrained by time required for the convergence of the transient voltage, and is determined by a transient response characteristic of the entire pulse signal reproducing section 112. Accordingly, a time interval between a pulse signal 121 and a next control pulse signal (hereinafter referred to as "period Toc") is set to be a waiting time which is determined in consideration of the transient response characteristic. According to an example shown in FIG. 1 (a), a length To of the pulse signal 121 is set to 9-clock cycle. It is desirable to set the length To which is three times longer than a time constant obtained in a state in which the first offset canceling loop 307 and the second offset canceling loop 308 are closed. Meanwhile, a period Toc-ag (period Toc) which is a time interval from a trailing edge of a pulse signal 121 to a leading edge of a pulse signal 110 is set to 14-clock cycle. The period Toc-ag is set to be longer than To, for safety's sake.

Here, the description of the noise detection mode M1 (a period indicated by the reference numeral 703 in FIG. 4) is resumed. In the noise detection mode M1, the pulse signal generating section 108 starts counting a first cycle T1 in response to a transition to the noise detection mode M1. The pulse signal generating section 108 supplies a pulse signal 121 to the pulse signal reproducing section 112 so as to cause the pulse signal reproducing section 112 to carry out offset canceling. Subsequently, the pulse signal generating section 108 supplies a pulse signal 110 to the latch section 116 after the period Toc-ag so as to cause the latch section 116 to detect presence or absence of an asynchronous reception. Next, the pulse signal generating section 108 supplies a pulse signal 117 to the RS flip-flops 114b and 116b again so that the latch sections 114 and 116 are reset.

In the above operations during the first cycle T1, a transition to the object detection mode M2 occurs in a case where absence of asynchronous reception can be confirmed by the judging section 118 at the end of the period indicated by the reference numeral 703 (more accurately, at a rising edge of a clock which is in the period and immediately before the input of the pulse signal 117), and in a case where absence of asynchronous reception cannot be confirmed, the noise detection mode M1 is carried out again while an output of the external output section 119 is being held.

This will be described here with reference to FIG. 4. In a case where an external disturbance light noise level 700 exceeds a sensitivity limit level (minimum sensitivity) 701 of the optical modulation-type detection device 150, a reproduced pulse signal 111 of the pulse signal reproducing section 112 is forcibly reset to an L level during the offset canceling period OC. On the other hand, during the period other than the offset canceling period OC, a transition from an H level to an L level or vice versa is repeated since external disturbance light is detected. Accordingly, the offset canceling period OC and the asynchronous reception period AG are alternated. Subsequently, in a case where the external disturbance light noise level 700 falls below the sensitivity limit level 701, the reproduced pulse signal 111 shifts to an L level. This allows absence of an asynchronous reception to be confirmed. Thus, a transition to the object detection mode M2 occurs.

The following description deals with the first cycle T1. For example, in a case where a clock signal 105 has a clock frequency of 125 kHz, the first cycle T1 is reasonably set to be approximately 8.2 ms which corresponds to 1024-clock cycle. The reason is as follows. Since a proximity sensor should have response characteristics in which human movements can be followed, it is sufficient to update an output in a time scale of approximately 100 ms. Therefore, also from a viewpoint of reduction in power consumption, it is necessary and sufficient to carry out internal operation of the optical modulation-type detection device 150 at a cycle of approximately 10 ms. A more important reason is to deal with a main factor contributing to external disturbance light noise, i.e., temporal change in light emission intensity of an inverter fluorescent light. The inverter fluorescent light is normally driven by a voltage which is obtained by directly rectifying a commercial power supply voltage so that the voltage thus rectified has a frequency of approximately 40 kHz to 60 kHz. Consequently, an envelope of an intensity of light emitted from the inverter fluorescent light has large swell which has an amplitude falls close to zero and which has a frequency of 100 Hz or 120 Hz which is twice the frequency of a commercial power supply frequency, i.e., 50 Hz or 60 Hz, respectively.

In view of this, according to the present embodiment, the first cycle T1 is set to be half or more than half of a period of a commercial power supply frequency, and the offset canceling period OC and the asynchronous reception period AG are alternated in the noise detection mode M1. This makes it possible to search a period in which high-sensitivity synchronous detection can be carried out without being adversely affected by an inverter fluorescent light. For this purpose, in a case where absence of asynchronous reception can be confirmed in the noise detection mode M1, a transition to the reflecting object detection mode M2 occurs, whereas, in a case where absence of asynchronous reception cannot be confirmed, the noise detection mode M1 is carried out again while an output of the external output section 119 is being held.

The first cycle T1 is variable. In a case where the first cycle T1 is set to be long, a frequency of update of determining presence or absence of an object decreases, but instead, (i) unnecessary light emission is avoided and (ii) there is an increase in percentage of a period during which unnecessary electric current consumption is prevented. This allows a large reduction in time-averaged electric current consumption of the optical modulation-type detection device 150. Moreover, it is useful to cause the first cycle T1 to be variable. This is because response time required for a detection device can be adjusted to the one which the user wishes to have. These effects can be obtained without affecting a circuit size, sensitivity of the detection device, and resistance to external disturbance light.

Next, a transition to the reflecting object detection mode M2 occurs in the continuing first cycle T1. First, the reflecting object detection mode M2 is described.

Figure 1B:
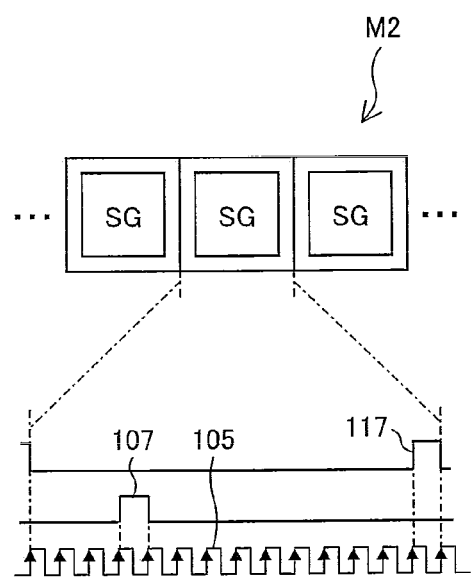
Figure 2:
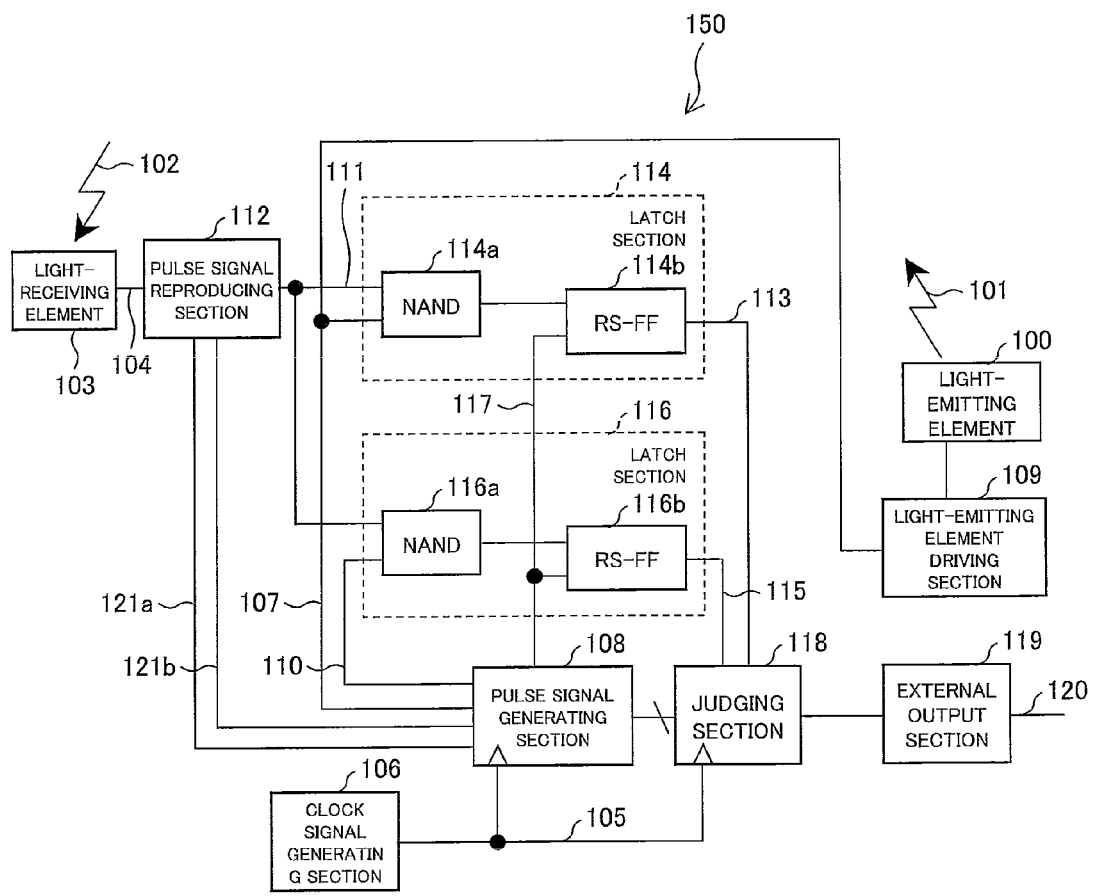
FIG. 2 is a block diagram showing an arrangement of substantial parts of the optical modulation-type detection device.

In the reflecting object detection mode M2, a synchronous reception period SG, in which presence or absence of the synchronous reception is detected, is repeated (the synchronous reception period SG has a length of 14-clock cycle) (see FIG. 1(b)). Presence or absence of an object is observed when an external disturbance light noise level falls below the sensitivity limit in a high-sensitivity state obtained immediately after offset canceling becomes effective in the noise detection mode M1.

In the reflecting object detection mode M2 (a period indicated by the reference numeral 704 in FIG. 4), the pulse signal generating section 108 supplies a pulse signal 107 to the light-emitting element driving section 109 so that the light-emitting element 100 is driven. This causes the light-emitting element 100 to emit pulsed light 101. In addition, the pulse signal generating section 108 supplies a pulse signal 107 to the latch section 114 so that presence or absence of synchronous reception is confirmed. Subsequently, the pulse signal generating section 108 supplies a pulse signal 117 to the RS flip-flops 114b and 116b again so as to reset the latch sections 114 and 116.

In a case where presence of synchronous reception can be confirmed, consecutively n times (n is a natural number), as a synchronous reception output signal 113 in the consecutive first cycle T1, the judging section 118 determines that a reflecting object is present, whereas, in a case where presence of synchronous reception cannot be confirmed, consecutively n times, as a synchronous reception output signal 113 in the consecutive first cycle T1, the judging section 118 determines that no reflecting object is present. FIG. 4 shows an example in which n=1 is satisfied. According to the example shown in FIG. 4, it is determined that a synchronous reception is present at the end of the first period indicated by the reference numeral 704 (more accurately, at a rising edge of a clock which is in the first period and immediately before the pulse signal 117), and an output signal 120 of the external output section 119 is updated (output signal 120 changes from a "no reflecting object is present" state (H) to a "reflecting object is present" state (L)).

The pulse signal generating section 108 supplies a pulse signal 117 to the RS flip-flops 114b and 116b again at the end of the first cycle T1 (1024-clock cycle) after the transition from the start-up mode M0 to the noise detection mode M1. This causes the latch sections 114 and 116 to be reset. Subsequently, a transition to the noise detection mode M1 occurs at the completion of the first cycle T1, so that the series of operations described above are carried out again. This is not shown in FIG. 4.

The suspending mode M3 is carried out until the first cycle T1 ends after it is determined that a reflecting object is present in the object detection mode M2. In a case where it is determined that a reflecting object is present at an early stage as in the case of FIG. 4, there remains plenty of time before the end of the first cycle T1. In the suspending mode M3, unnecessary operations such as driving of the light-emitting element 100 are suspended until the end of the first cycle T1 so that time-averaged electric current consumption of the optical modulation-type detection device 150 can be further reduced. This will be described later in more detail.

In contrast, in a case where a transition to the noise detection mode M1 occurs after it is determined that a reflecting object is present in the object detection mode M2, then a transition to the object detection mode M2 occurs regardless of detection result obtained during the asynchronous reception period AG after the offset canceling period OC. This makes it possible to avoid a freeze state even under a unique situation, in which an extraordinary increase in light-emitting signal due to external disturbance light and the like, occurs in a state in which it is once determined that an object is present. The freeze state is a state in which no transition to the object detection mode can occur and there is no chance to drive the light-emitting element 100.

Further, according to the pulse signal reproducing section 112, the hysteresis control circuit 306 sets the hysteresis smaller in a case where it is determined that a reflecting object is present in the object detection mode M2 than in a case where it is determined that no reflecting object is present. This makes it possible to add an algorithmic hysteresis which varies depending on a detection state in a relatively long time scale to normal hysteresis which is inherent in the comparison section 303 and which causes the comparison section 303 to operate in a time scale equivalent to a pulse width. As such, it is possible to further prevent malfunction without causing a large increase in circuit size and electric current consumption.

Further, the optical modulation-type detection device 150 has the continuous shutdown mode M4. In the continuous shutdown mode M4, power supply to all of the sections constituting the optical modulation-type detection device 150 is stopped. This will be described later in more detail.

As described above, in a case where high integration, in which analog and digital elements are mixed (pulse signal reproducing section 112), is intended by use of a fine CMOS process so as to realize a compact detection device, an offset voltage generated in the integrated circuit due to variations in the elements of the integrated circuit becomes a principal factor which causes a large deterioration in sensitivity of the detection device. However, an arrangement for suppressing the offset voltage is generally a stationary state (full-time connection), and therefore requires a large phase compensation capacity, thereby causing a large circuit size.

In view of this, first, the optical modulation-type detection device 150 causes the first offset canceling loop 307 and the second offset canceling loop 308, to which power is supplied only during offset canceling, to carry out offset canceling. Next, presence or absence of asynchronous reception, i.e., presence or absence of influence of external disturbance light noise is detected in a state in which the offset canceling is effective. After absence of the influence of the external disturbance light is detected, presence or absence of synchronous reception, i.e., presence or absence of an object is detected.

The arrangement eliminates the need for an arrangement in which offset canceling is continuously carried out so that a large phase compensation capacity is required, and makes it possible to drive the light-emitting element after searching a state in which no influence of external disturbance light exists while continuously suppressing an offset of the pulse signal reproducing section 112. This makes it possible to detect presence or absence of an object in a high-sensitivity state. As such, it is possible to improve sensitivity and prevent malfunction of the optical modulation-type detection device 150 without causing an increase in circuit size and bias current. According to the optical modulation-type detection device 150, it is thus possible (i) to realize a reduction in power consumption without sacrificing detection sensitivity and response characteristics required for a detection device, and (ii) to realize a reduction in size of the device without increasing a circuit size.

According to a circuit which is entirely configured by CMOS shown in FIG. 3, a time period during which a state obtained at the time of completion of offset canceling can be maintained within an allowable accuracy varies depending on a leak current from a transmission gate and a leak current from a gate of an amplifier input section. The leak currents increase exponentially in accordance with an increase in environmental temperature. In contrast to analog circuit designing as shown in FIG. 3, functional design as shown in FIG. 1 requires taking into consideration (i) values desired from a functional aspect and (ii) margins for physical limit values under respective circumstances such as operation in high temperature. A time period during which a state obtained at the time of completion of offset canceling in the noise detection mode M1 can be maintained within an allowable range is limited. However, in a case where each of the operation modes is arranged as above, it is possible to set an upper value with respect to a time interval from the end of an offset canceling period OC to the start of an asynchronous reception period AG or to the start of a synchronous reception period SG. It is therefore possible to keep a normal operation with respect to a complicated change in external disturbance light noise level while repeating the noise detection mode M1 and the object detection mode M2 at a constant cycle.

Further, in a case where the object detection mode M2 has the simplest arrangement, i.e., in a case where the object detection mode M2 only has a synchronous reception period (an arrangement is possible in which the object detection mode M2 includes an offset canceling period OC and an asynchronous reception period AG (later described)), the synchronous reception period SG is repeated many times before an external disturbance light noise level changes so that reliability of a judgment result can be obtained. Further, it is possible to shorten a time period from a transition to the object detection mode M2 to judgment as to whether an output signal 120 of the external output section 119 is updated and/or maintained, via a synchronous reception period SG, or overall measurement time required in a case where the synchronous reception period SG is repeated. This makes it possible to carry out the largest number of synchronous measurements during a single offset canceling operation, as is easily understood from comparisons with later described arrangements (FIGS. 5 through 7).

[Modifications of Operation Mode]

Figure 5A:
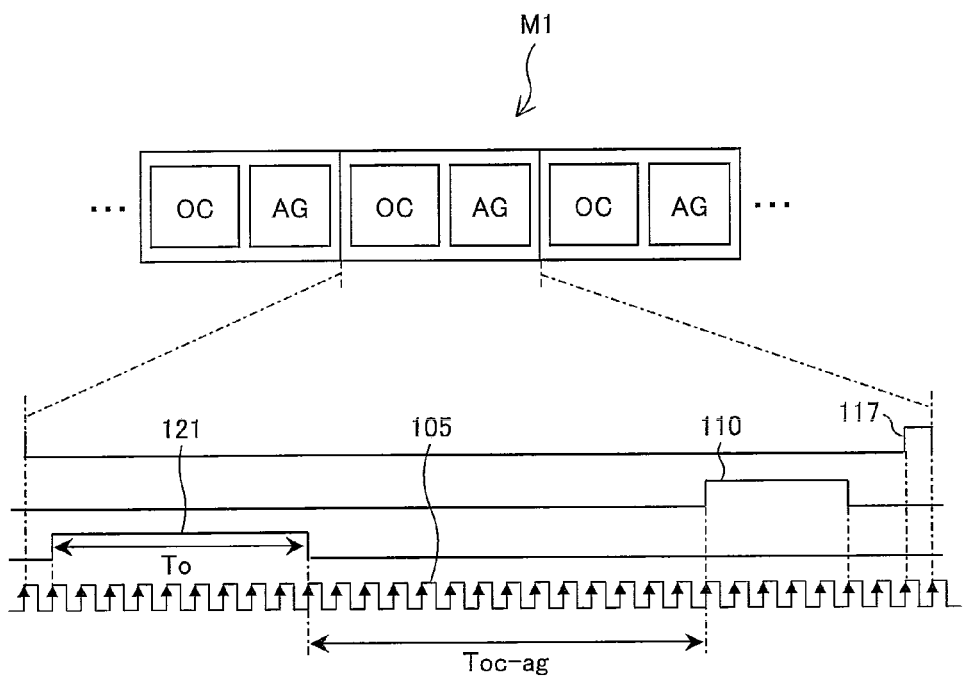
FIG. 5 is a view showing a modification of the main operation modes of the optical modulation-type detection device, and is a timing chart of signals indicative of how the operations are carried out in the respective operation modes, FIG. 5 (a) shows a noise detection mode, and FIG. 5 (b) shows an object detection mode.
Figure 5B:
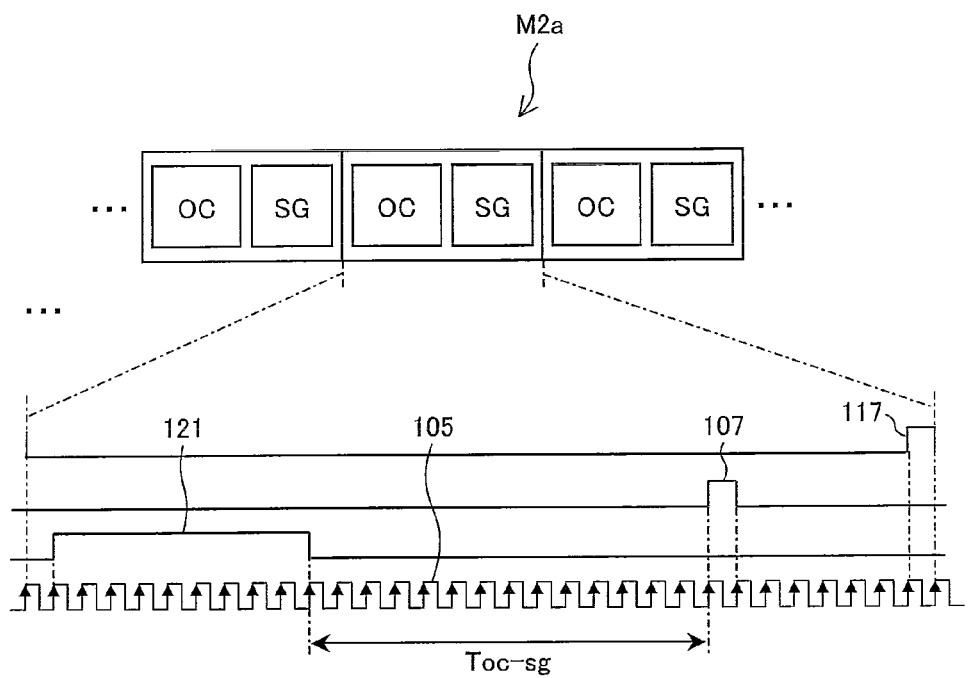
Figure 6A:
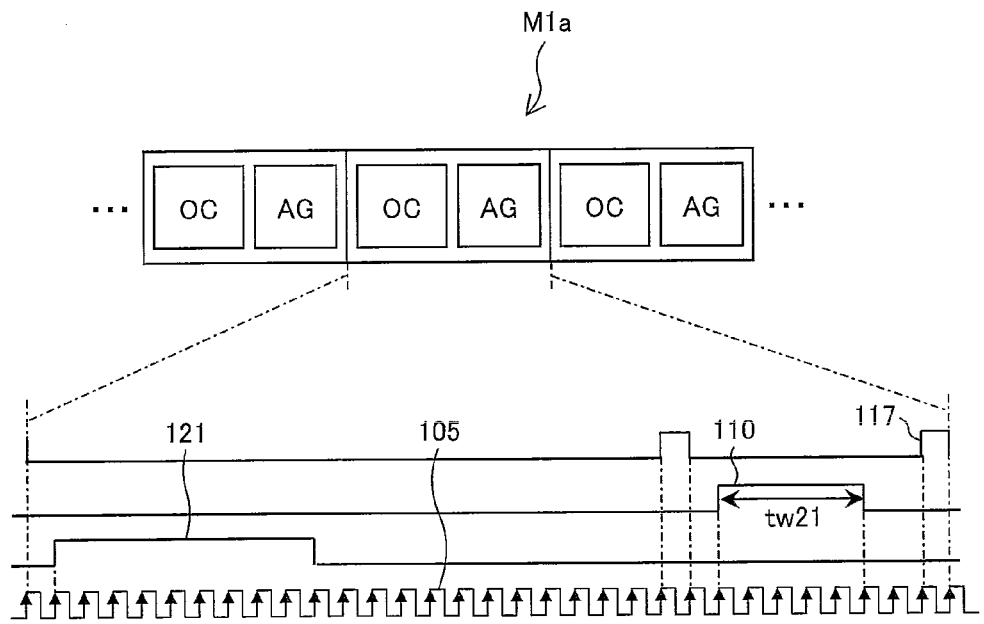
FIG. 6 is a view showing another modification of the main operation modes of the optical modulation-type detection device, and is a timing chart of signals indicative of how the operations are carried out in the respective operation modes, FIG. 6 (a) shows a noise detection mode, and FIG. 6 (b) shows an object detection mode.
Figure 6B:
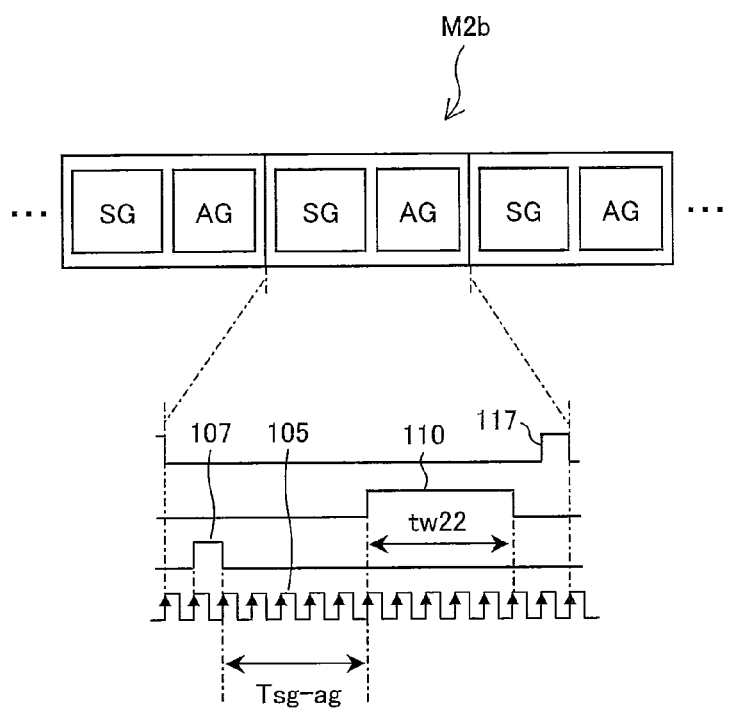
Figure 7A:
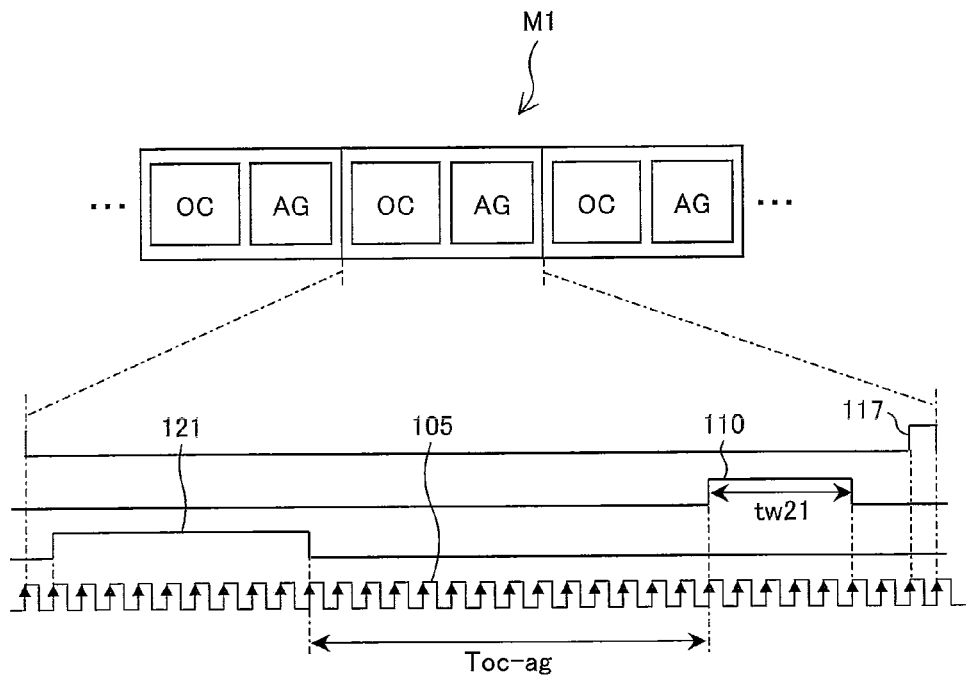
FIG. 7 is a view showing still another modification of the main operation modes of the optical modulation-type detection device, and is a timing chart of signals indicative of how the operations are carried out in the respective operation modes, FIG. 7 (a) shows a noise detection mode, and FIG. 7 (b) shows an object detection mode.
Figure 7B:
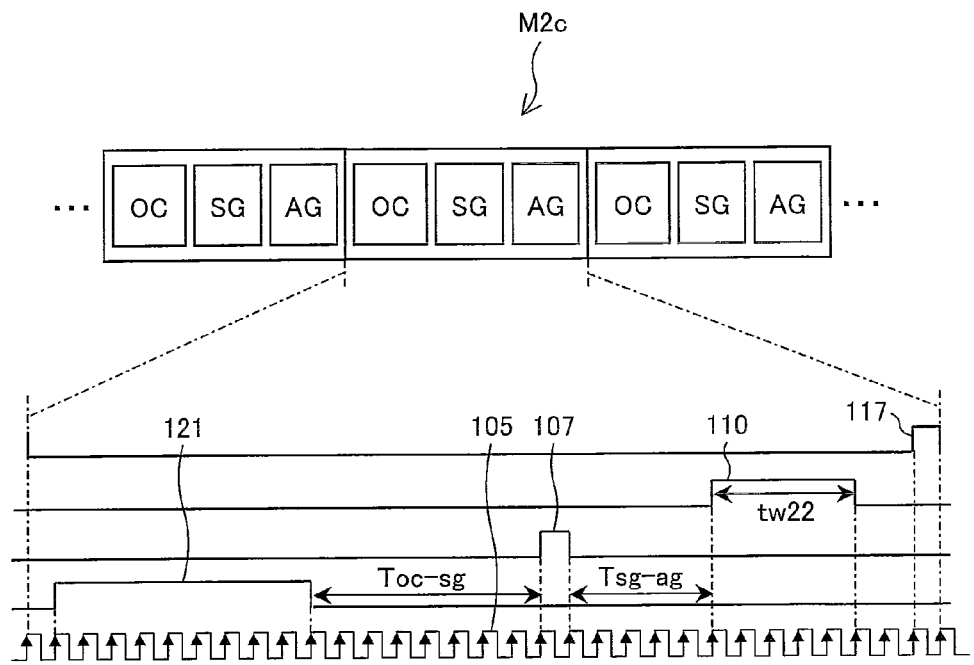

The following description deals with modifications of the noise detection mode M1 and the object detection mode M2 with reference to FIGS. 5 through 7. Basically, only differences from the noise detection mode M1 and the object detection mode M2 will be described. FIGS. 5 through 7 show combinations of noise detection mode M1 and reflecting object detection mode M2 of the respective modifications. Note however that combinations are not limited to those in the drawings but those combinations can be substituted for other suitable combinations of noise detection mode M1 and reflecting object detection mode M2. Note also that contents of the respective modifications are not limited to those described here but can be suitably applied to a noise detection mode, a reflecting object detection mode, and a period such as an offset canceling period.

(Modification 1)

FIG. 5 is a view showing a modification of main operation modes of the optical modulation-type detection device 150 (upper part of FIG. 5), and is a timing chart of signals indicative of how the operations are carried out in the respective operation modes (lower part of FIG. 5). FIG. 5 (a) shows a noise detection mode M1, and FIG. 5 (b) shows an object detection mode M2a.

The noise detection mode M1 shown in FIG. 5 (a) is identical to the above-mentioned noise detection mode M1. This means that an offset canceling period OC and an asynchronous reception period AG are secured once in each 32-clock cycle period which is repeated so that an external disturbance light noise level is observed in a high-sensitivity state obtained immediately after offset canceling becomes effective.

Meanwhile, the object detection mode M2a shown in FIG. 5 (b) is obtained by adding an offset canceling period OC to an object detection mode M2. This means that an offset canceling period OC and a synchronous reception period SG are secured once in each 32-clock cycle period which is repeated. The object detection mode M2a makes it possible for a period Toc-ag in the noise detection mode M1 to have the same conditions as a period Toc-sg in the object detection mode M2a. Note that each of the period Toc-ag and the period Toc-sg is a period from the completion of the offset canceling to convergence of a transient voltage which is generated when the optical modulation-type detection device 150 returns to a normal operation state.

Although it is unnecessary to accomplish a perfect matching in the number of clock cycle, the above arrangement makes it possible to detect presence or absence of an object with higher sensitivity, as compared to a case (e.g. object detection mode M2) in which no offset canceling period OC is included.

Note that, in the reflecting object detection mode M2a, the light-emitting element 100 is driven during a single cycle of the 32-cycle (duty in the period is approximately 3%). The optical modulation-type detection device 150 consumes the largest amount of power during driving of the light-emitting element 100, and average power consumption varies directly depending on the duty. However, as described below, the optical modulation-type detection device 150 has effective light emission duty which is one order of magnitude less than the above-mentioned value. It follows that the optical modulation-type detection device 150 can have average electric current consumption that is equal to or less than overall power consumption of the clock signal generating section 106 or the pulse signal reproducing section 112.

(Modification 2)

FIG. 6 is a view showing a modification of main operation modes of the optical modulation-type detection device 150 (upper part of FIG. 6), and is a timing chart of signals indicative of how the operations are carries out in the respective operation modes (lower part of FIG. 6). FIG. 6 (a) shows a noise detection mode M1a, and FIG. 6 (b) shows an object detection mode M2b.

A noise detection mode M1a shown in FIG. 6 (a) is basically identical to the above-mentioned noise detection mode M1. This means that an offset canceling period OC and an asynchronous reception period AG are secured once in each 32-clock cycle period which is repeated so that an external disturbance light noise level is observed in a high-sensitivity state obtained immediately after offset canceling becomes effective.

However, the noise detection mode M1a is different from the noise detection mode M1 in that another pulse signal 117 is supplied immediately before a pulse signal 110 becomes active so as to reset the latch section 116. This causes no change in latch output which is in a normal operation state, but makes it possible to more surely prevent malfunction. For example, in a case where a sudden transient response is caused by an offset canceling operation, there is a possibility that an unnecessary trigger pulse is supplied to the RS flip-flop 116b so that a state, in which presence of asynchronous reception is detected, is set. Such another pulse signal 117 is useful in preventing malfunction, provided that it is inserted so that such another pulse signal 117 and a pulse signal 107 or a pulse signal 110 do not overlap each other on a time axis. It should be understood that this can be also applied to the other modifications.

Meanwhile, according to the reflecting object detection mode M2b shown in FIG. 6 (b), the synchronous reception period SG and the asynchronous reception period AG are secured once in each 14-clock cycle period which is repeated. This arrangement makes it possible to deal with a situation in which external disturbance light becomes significantly strong for some reason immediately after a transition to a reflecting object detection mode M2b because falling of an external disturbance light level below a sensitivity limit in the noise detection mode is detected. In such a situation, it is preferably determined that a reflecting object is present in a case where a pair state is obtained in which presence of synchronous reception and absence of asynchronous reception are obtained during a synchronous reception period SG and an asynchronous reception period AG, respectively, in each 14-clock cycle period. It is possible to confirm that the presence of a synchronous reception is not caused by external disturbance light, by always observing an asynchronous reception immediately after the synchronous reception in each 14-clock cycle period. Alternatively, it is possible to obtain stronger resistance to external disturbance light, by determining that a reflecting object is present on the basis of the fact that such a pair state can be repeatedly obtained in succession more than once. How many times such a pair state is obtained will be described below in detail.

Meanwhile, caution should be needed with regard to time interval Tsg-ag, in a case where synchronous reception and asynchronous reception are consecutively carried out in the reflecting object detection mode M2b. In a case where the pulse signal reproducing section 112 is arranged by use of the AC-coupling technique (see FIG. 3), a light-reception signal 104 may have a negative direction sag whose AC coupling time constant is longer than a pulse width, once the pulse signal reproducing section 112 receives the light-reception signal 104. In a case where the pulse signal reproducing section 112 receives a next light-reception signal 104 before the negative direction sag disappears, amplitude of the next light-reception signal 104 is reduced. This causes a deterioration in sensitivity. If an asynchronous reception is carried out immediately after a synchronous reception under the circumstances, then it becomes more likely that it is determined that no asynchronous reception is present, even though an asynchronous reception is actually present after a synchronous reception is judged to be present. This gives rise to malfunction of the detection device.

In view of this, (i) a low pass frequency characteristic, obtained in a state in which the first offset canceling loop 307 and the second offset canceling loop 308 are opened, is optimized with respect to a pulse light width of 1 clock cycle with the use of the capacitor C8 (band limiting capacitance) of the comparison section 303 in the pulse signal reproducing section 112, and (ii) a time interval Tsg-ag from the end of synchronous reception to the beginning of asynchronous reception is set to 5 clock cycle, and a time interval from the end of synchronous reception to the end of an asynchronous gate is set to be sufficiently long, i.e., 10-clock cycle, the setting of the time intervals being carried out with respect to the pulse signal reproducing section 112 having a frequency response characteristic whose midband bandwidth is of a single-digit. With the arrangement, it is possible to carry out an asynchronous reception with sensitivity similar to that in a synchronous reception period.

The arrangement allows the optical modulation-type detection device 150 to detect presence or absence of an object, (i) with less affected by more complicated temporal change in external disturbance light level, (ii) with having less malfunction, and (iii) with higher sensitivity even under bad environment especially as compared with a case, such as the object detection mode M2, in which no asynchronous reception period AG is included.

Note that the pulse width (first pulse width) tw 21 of a pulse signal 110 during the asynchronous reception period AG in the noise detection mode M1 and the noise detection mode M1a is not necessarily the same as the pulse width tw 22 (second pulse width) of a pulse signal 110 in the asynchronous reception period AG during which an algorithmic hysteresis is added in the object detection mode M2b. Note however that the pulse width tw 21 can be the same as the pulse width tw 22.

With the arrangement, the pulse signals 110 having the respective first and second pulse widths serve as equivalent gate signals with respect to external disturbance light including a specific frequency component. That is, even if something bad occurs to the frequency response characteristic of the pulse signal reproducing section 112, an asynchronous reception result can be always obtained in the same manner regardless of operation modes. This makes it possible to avoid a situation in which a desired detection cannot be carried out because sensitivity and/or response in the asynchronous reception period vary depending on (i) operation modes and (ii) conditions for determining the transition of the operation modes.

Further, it is preferable that each of the pulse width tw 21 and the pulse width tw 22 is set to be longer than an inverse of a frequency at which the light intensity becomes highest among frequency components of main external disturbance light components under a circumstance where the optical modulation-type detection device 150 is assumed to be used. With the arrangement, it is possible to more effectively carry out asynchronous reception with respect to frequency components of external disturbance light noise which has no relationship with the operation of the optical modulation-type detection device 150. Note that the pulse width tw 21 and the pulse width tw 22 can be applied to the following Modification 3.

(Modification 3)

FIG. 7 is a view showing a modification of the main operation modes of the optical modulation-type detection device 150 (upper part of FIG. 7), and is a timing chart of signals indicative of how the operations are carried out in the respective operation modes (lower part of FIG. 7). FIG. 7 (a) shows a noise detection mode M1, and FIG. 7 (b) shows an object detection mode M2c.

The noise detection mode M1 shown in FIG. 7 (a) is identical to the above-mentioned noise detection mode M1. This means that an offset canceling period OC and an asynchronous reception period AG are secured once in each 32-clock cycle period which is repeated so that an external disturbance light noise level is observed in a high-sensitivity state obtained immediately after offset canceling becomes effective.

Meanwhile, according to the object detection mode M2c shown in FIG. 7 (b), an offset canceling period OC, an asynchronous reception period AG, and a synchronous reception period SG are secured once in each 32-clock cycle period which is repeated.

The arrangement offers more improved resistance to external disturbance light even if external disturbance light becomes strong again for some reason after a transition to the object detection mode M2c since, according to the arrangement, it is determined that a reflecting object is present in a case where a pair state in which presence of synchronous reception and absence of asynchronous reception are obtained can be obtained. Further, the arrangement makes it possible (i) to continuously and stably suppress an offset of the pulse signal reproducing section 112, (ii) to drive a light-emitting element after searching a state in which no influence of external disturbance light is present, and (iii) to stably and continuously detect reflection light with higher sensitivity, thereby realizing a reflecting object detection mode having the highest sensitivity.

As is early described, a time period during which an offset canceling result can be maintained within an allowable range of accuracy is limited. In the Modification 2 shown in FIG. 6, a single offset canceling operation needs to cover (i) an asynchronous reception period AG in the final cycle of the noise detection mode M1a and (ii) n pairs of synchronous reception period SG and asynchronous reception period AG in the object detection mode M2b. It is, however, not possible to increase n endlessly. In contrast, according to the Modification 3 shown in FIG. 7, an offset canceling period OC can be also included in the object detection mode M2c at any place.

That is, the Modification 3 is not limited to the arrangement shown in FIG. 7 in which "offset canceling period OC/synchronous reception period SG/asynchronous reception period AG" are secured in this order. Instead, it is also possible that "offset canceling period OC/synchronous reception period SG/offset canceling period OC/asynchronous reception period AG" are secured in this order.

This eliminates limitation on a value of n which is the number of pairs of a synchronous reception period SG and an asynchronous reception period AG, thereby realizing still higher sensitivity and higher stability. Note however that, in a case where a time interval Tsg-ag between a synchronous reception period SG and an asynchronous reception period AG is made too large, the effect of preventing malfunction is likely to be lessened since a correlation is weakened between a synchronous reception period SG and an asynchronous reception period AG which belong to an identical pair. Further, as described in the Modification 1, a time interval between a synchronous reception period SG and an asynchronous reception period AG cannot be narrowed beyond a certain degree. As shown in FIG. 7 (b), it is necessary that (i) the synchronous reception period SG is secured to come early at the expense of settling margin time of an offset canceling period OC or (ii) the number of clock cycles required in the object detection mode M2c is made larger than the examples which have been already described.

(Operation of Optical Modulation-type Detection Device Based on Modifications of Operation Modes)

Figure 8:
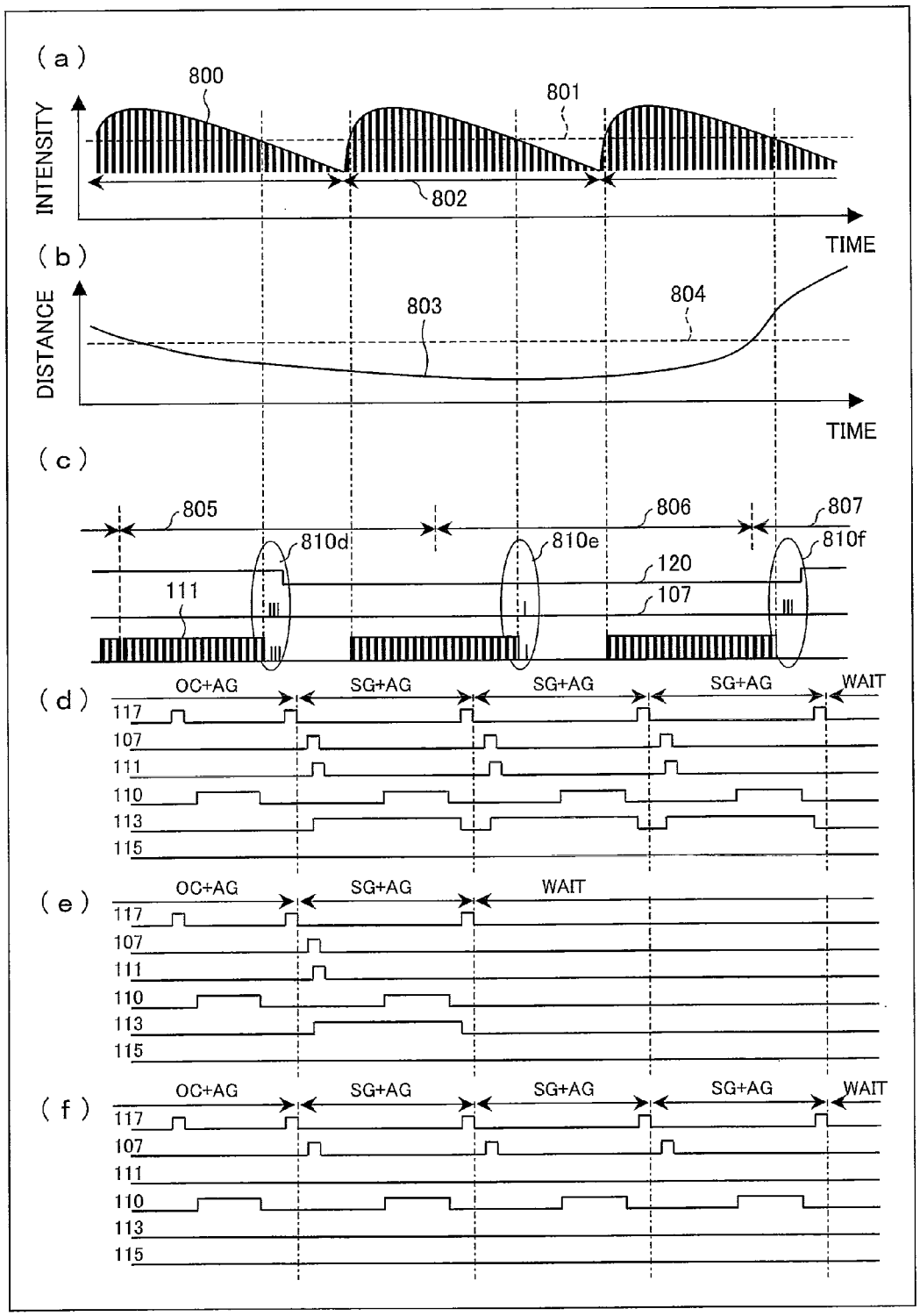
FIG. 8 is a view showing how the optical modulation-type detection device which adopts the modification shown in FIG. 6 mainly operates, FIG. 8 (a) is a graph showing an external disturbance light noise level (only envelope is shown in the graph) with respect to a temporal change, a vertical axis indicating intensity and a horizontal axis indicating time, FIG. 8 (b) is a graph showing a distance between the optical modulation-type detection device and a reflecting object with respect to temporal change, a vertical axis indicating the distance and a horizontal axis indicating time, FIG. 8 (c) is a timing chart of signals which shows how the operations work, FIG. 8 (d) is a timing chart of signals which is obtained in a case where an output signal of an external output section is changed from a "reflecting object is not present" state into a "reflecting object is present" state (the output signal is changed from an H level into an L level), FIG. 8 (e) is a timing chart of signals which is obtained in a case where the output signal is in a "reflecting object is present" state, and FIG. 8 (f) is a timing chart of signals which is obtained in a case where the output signal is changed from a "reflecting object is present" state into a "reflecting object is not present" state (the output signal is changed from an L level into an H level).

The following description deals with how the optical modulation-type detection device 150 operates which adopts the modifications of the respective operation modes, by taking the Modification 2 (see FIG. 6) for example, with reference to FIG. 8.

FIG. 8 shows main operations of the optical modulation-type detection device 150 which adopts the Modification 2. FIG. 8 (a) is a graph showing an external disturbance light noise level (only envelope is shown in the graph) with respect to temporal change, a vertical axis indicating intensity and a horizontal axis indicating time. FIG. 8 (b) is a graph showing a distance between the optical modulation-type detection device 150 and a reflecting object with respect to temporal change, a vertical axis indicating the distance and a horizontal axis indicating time. FIG. 8 (c) is a timing chart of signals indicative of how the optical modulation-type detection device 150 operates. FIG. 8 (d) is a timing chart of signals which is obtained in a case where an output signal 120 of an external output section 119 is changed from a "no reflecting object is present" state into a "reflecting object is present" state (the output signal 120 is changed from an H level into an L level). FIG. 8 (e) is a timing chart of signals which is obtained in a case where the output signal 120 is in a "reflecting object is present" state. FIG. 8 (f) is a timing chart of signals which is obtained in a case where the output signal 120 is changed from a "reflecting object is present" state into a "no reflecting object is present" state (the output signal 120 is changed from an L level into an H level).

Note that, in FIG. 8 (a), a broken line indicated by the reference numeral 801 indicates a sensitivity limit level of the optical modulation-type detection device 150, and the arrow indicated by the reference numeral 802 indicates a fluctuation period. Further, in FIG. 8 (b), a broken line indicated by the reference numeral 804 indicates a distance within which proximity detection is possible in the optical modulation-type detection device 150. The distance within which proximity detection is possible is determined/changed in accordance with optical design of the optical modulation-type detection device 150, a light-emission amount of the light-emitting element 100, and hysteresis setting of the pulse signal reproducing section 112. Further, in FIG. 8 (c), each of the arrows indicated by reference numerals 805 through 807 indicates a first period T1 which is set to be longer than the fluctuation period 802 shown in FIG. 8 (a).

A start-up mode M0 is identical to the foregoing start-up mode M0 which is employed in a case where the noise detection mode M1 and the reflecting object detection mode M2 are employed, and therefore is not explained repeatedly. Further, a noise detection mode M1a is identical to the noise detection mode M1, except that a pulse signal 117 is outputted immediately before a pulse signal 110 becomes active, and is therefore not explained repeatedly.

As is early described, according to the reflecting object detection mode M2b, a synchronous reception period SG and an asynchronous reception period AG are secured once in each 14-clock cycle period which is repeated. In the reflecting object detection mode M2b, (i) conditions for determining the transition of operation modes and (ii) conditions for determining a next external output are changed depending on a current external output result. This causes an addition of algorithmic hysteresis.

Specifically, in a case where an output signal 120 of the external output section 119 shows a "no reflecting object is present" state, it is determined that a reflecting object is present if a pair state, in which presence of synchronous reception and absence of asynchronous reception are obtained in a synchronous reception period SG and an asynchronous reception period AG respectively, is obtained consecutively n times (n is a natural number) during a first period T1 by which the noise detection mode M1 is followed. If not, it is determined that no reflecting object is present. On the other hand, in a case where an output signal 120 of the external output section 119 shows a "reflecting object is present" state, it is determined that a reflecting object is present, regardless of presence or absence of asynchronous reception in an asynchronous reception period AG, if absence of synchronous reception is obtained consecutively n times (n is a natural number) in a synchronous reception period SG. If not, it is determined that no reflecting object is present.

FIG. 8 shows an example in which n=3 is satisfied. The following description deals with operations in the object detection mode M2b with reference to FIG. 8. Explanation of the start-up mode M0 and the noise detection mode M1a is omitted. Note that explanation of the object detection mode M2b is divided into three cases: (i) a case where an output signal 120 of the external output section 119 is changed from a "no reflecting object is present" state into a "reflecting object is present" state (the output signal 120 is changed from an H level to an L level) (see FIG. 8 (d) and the period indicated by the reference numeral 805 in FIG. 8 (c)), (ii) a case where the output signal 120 maintains a "reflecting object is present" state (see FIG. 8 (e) and the period indicated by the reference numeral 806 in FIG. 8 (c)), and (iii) a case where the output signal 120 is changed from a "reflecting object is present" state into a "no reflecting object is present" state (the output signal 120 is changed from an L level to an H level) (see FIG. 8 (f) and the period indicated by the reference numeral 807 in FIG. 8 (c)).

First explained is a case where an output signal 120 of the external output section 119 is changed from a "no reflecting object is present" state into a "reflecting object is present" state (the output signal 120 is changed from an H level to an L level). In this case, a transition to the object detection mode M2b occurs, via the final cycle of the noise detection mode M1a which includes an offset canceling period OC and an asynchronous reception period AG (indicated by "OC+AG" at the left end of FIG. 8 (d)). In the object detection mode M2b, a cycle including a synchronous reception period SG and an asynchronous reception period AG (indicated by "SG+AG" in FIG. 8) is repeated three times. During the three cycles, reproduced pulse signal 111 of the pulse signal reproducing section 112 is merely reproduced slightly after pulsed light 101 is generated in response to a pulse signal 107 (see reference numeral 810d of FIG. 8(c)), but no excessive pulse string generated in sync with reproduction of external disturbance light and/or noise can be observed. Accordingly, a synchronous reception output signal 113 is generated in each of the consecutive three cycles, but no asynchronous reception output 115 is generated. Since presence of synchronous reception and absence of asynchronous reception are consecutively obtained three times (three cycles), it is determined, in the last one of the consecutive three cycles (in fact, the clock which is one clock before the last cycle as in FIG. 4), that a reflecting object is present, so that an output signal 120 of the external output section 119 is updated to be changed from an H level into an L level.

As shown in FIG. 8 (c), after the update of the output signal 120, there remains about half the first period T1 (the period indicated by reference numeral 805). In a case where such free running time period is generated, the optical modulation-type detection device 150 enters into an suspending mode M3 in which unnecessary driving of the light-emitting element 100 and unnecessary offset canceling in the pulse signal reproducing section 112 are suspended (during a period indicated by "WAIT" on a right end of FIG. 8 (d), each of pulse signals 107, 110, 117, and 121 remains in the L level).

The suspending mode M3 varies depending on the type of the object detection mode. Specifically, in the suspending mode M3, (i) supply of a pulse signal 107 used for driving the light-emitting element 100 is suspended, (ii) not only supply of a pulse signal 107 but also supply of a pulse signal 121 serving as a gate signal for offset canceling in the pulse signal reproducing section 112 is suspended, (iii) power supply to at least a part of the light-emitting element driving section 109 and the pulse signal reproducing section 112 is suspended, or (iv) all of the (i) through (iii) are carried out.

In a case where the suspending mode M3 is thus carried out, for example, during the period indicated by the reference numeral 805, the light-emitting element is actually driven for only three-clock cycles. Accordingly, in a case where the period indicated by the reference numeral 805 has 1024-clock cycles, the effective duty ratio is low, i.e., approximately 0.3% during the period indicated by the reference numeral 805. This allows a reduction in an average of the electric current consumption per hour in the optical modulation-type detection device 150.

When the period indicated by the reference numeral 805 ends, a period indicated by the reference numeral 806 starts, so that the optical modulation-type detection device 150 carries out a noise detection mode M1a again. This causes an external disturbance light noise level to be continuously observed.

Next explained is a case where an output signal 120 maintains a "reflecting object is present" state. In this case, as in FIG. 8 (d), a transition into the object detection mode M2b occurs via the final cycle of the noise detection mode M1a (indicated by "OC+AG" on a left end of FIG. 8 (e)) which includes an offset canceling period OC and an asynchronous reception period AG. The object detection mode M2b has one cycle (indicated by "SG+AG" in FIG. 8 (e)) which includes a synchronous reception period SG and an asynchronous reception period AG. During the one cycle, a reproduced pulse signal 111 of the pulse signal reproducing section 112 is merely reproduced slightly after pulsed light 101 is generated in response to a pulse signal 107 (see reference numeral 810e of FIG. 8(c)), but no excessive pulse string generated in sync with reproduction of external disturbance light and/or noise can be observed.

In a case where a transition to the object detection mode M2b occurs while an output signal 120 is showing a "reflecting object is present" state, it becomes definite that a current external output is maintained until the end of the first cycle T1 in a case where at least one presence of synchronous reception can be obtained during the first period T1, regardless of presence or absence of an asynchronous reception, the asynchronous reception and the synchronous reception constituting a pair. Specifically, presence of synchronous reception is detected during the one cycle, and it is determined, at the end of the cycle (in fact, the clock which is one clock before the end of the cycle as in FIG. 4), that a reflecting object is present so that an output signal 120 of the external output section 119 maintains the L level. This in turn means that current external output is updated in a case where absence of synchronous reception is obtained consecutively three times (three cycles) during the first cycle T1 regardless of presence or absence of corresponding asynchronous reception.

The suspending mode M3 is carried out until the end of the period indicated by the reference numeral 806 since judgment is made at an early stage like the case shown in FIG. 8 (d). In this case, since the light-emitting element is actually driven for only one clock cycle, effective duty during the period is approximately 0.1%, provided that the period indicated by the reference numeral 806 has 1024 clock cycles.

Similarly, when the period indicated by the reference numeral 805 ends, a period indicated by the reference numeral 807 starts, so that the optical modulation-type detection device 150 carries out a noise detection mode M1a again. This causes an external disturbance light noise level to be continuously observed.

Explained next is a case where an output signal 120 of the external output section 119 is changed from a "reflecting object is present" state into a "no reflecting object is present" state (the output signal 120 is changed from the L level into the H level). In this case, as in the case of FIG. 8 (d), a transition to the object detection mode M2b occurs via the final cycle of the noise detection mode Mia (indicated by "OC+AG" on the left end of FIG. 8 (f)) which includes an offset canceling period OC and an asynchronous reception period AG. Conditions determining transition of the operation modes and conditions determining update/maintenance of external output are identical to those of the period indicated by the reference numeral 806. That is, current external output is updated regardless of presence or absence of corresponding asynchronous reception in a case where absence of synchronous reception is obtained consecutively three times (three cycles) during the first cycle T1. In the period indicated by the reference numeral 807, absence of synchronous reception is obtained consecutively three times since a reproduced pulse signal 111 of the pulse signal reproducing section 112 is not reproduced during the three cycles (see the reference numeral 810f in FIG. 8 (c)) regardless of the fact that pulsed light 101 generated due to a pulse signal 107 is emitted. Thus, an output signal 120 of the external output section 119 is updated from the L level to the H level. Subsequently, the suspending mode M3 is carried out until the end of the period indicated by the reference numeral 807.

As is clear from the description, the optical modulation-type detection device 150 of the present embodiment can continue a normal operation even in a case of a complicated change in external disturbance light noise level while repeating a noise detection mode and an object detection mode at a constant cycle.

Further, in a case where each of noise detection mode and object detection mode has an asynchronous reception period AG (e.g. Modifications 2 and 3), the resistance to external disturbance light is remarkably improved when "a reflecting object is present" is determined after "no reflecting object is present" is determined, provided that the determining is carried out based on a pair state in which synchronous reception and asynchronous reception are obtained in this order. That is, it is possible for a noise detection mode to be carried out again while the last determined result concerning presence or absence of a reflecting object is maintained, in a situation where an envelope or extremely low frequency components of external disturbance light monotonically becomes stronger immediately after the transition from a noise detection mode to an object detection mode. This makes it possible to effectively avoid wrong detection which may occur during a synchronous reception period.

Further, it is possible to set an algorithmic hysteresis based on the fact that a light-reception signal derived from the external disturbance light cannot have a negative value in a case where (i) a condition under which it is determined that a transition occurs from a "reflecting object is present" state to a "no reflecting object is present" state and (ii) a condition under which it is determined that a transition occurs from a "no reflecting object is present" state to a "reflecting object is present" state occurs are made asymmetrical to each other. Consequently, it is possible to improve sensitivity of the detection device and to prevent malfunction, without causing an increase in circuit size and bias current.

As is clear from the descriptions dealing with the concrete arrangements of the respective operation modes, various modifications can be made, for example, by changing a combination of periods during which pulse signals 107, 110, 117, and 121 are generated, initial operation conditions, judgment conditions concerning transition of operation modes, and judgment conditions concerning external output, and/or by adding a new operation mode.

Further, as is early described, the optical modulation-type detection device 150 carries out the continuous shutdown mode M4. In the continuous shutdown mode M4, power supply to all of the constituents of the optical modulation-type detection device 150 is stopped. A transition to the continuous shutdown mode M4 occurs (i) in a state in which none of the pulse signals 107, 110, 117, and 121 is generated and (ii) in a state in which a light-reception signal pathway of the pulse signal reproducing section 112 is cut off. That is, such a transition to the continuous shutdown mode M4 occurs during an offset canceling period OC, during a transition to an offset canceling period OC, during a transition in each of the operation modes except the continuous shutdown mode M4 and during a transition in each of the periods. Further, it is preferable to realize a state in which none of the pulse signals 107, 110, 117, and 121 is generated, via the suspending mode M3 (intermediate state in which the generation of pulse signals 107, 110, 117, and 121 is stopped until the end of the first cycle T1 after an external output is updated and/or held in the object detection mode M2). Further, a counter for generating timing for this can be provided separately. The continuous shutdown mode M4 makes it possible to surely prevent a situation in which a shutdown operation is externally carried out independently of the operations of the optical modulation-type detection device 150 so that a pass through current which flows from a power source to ground is generated.

Figure 9:
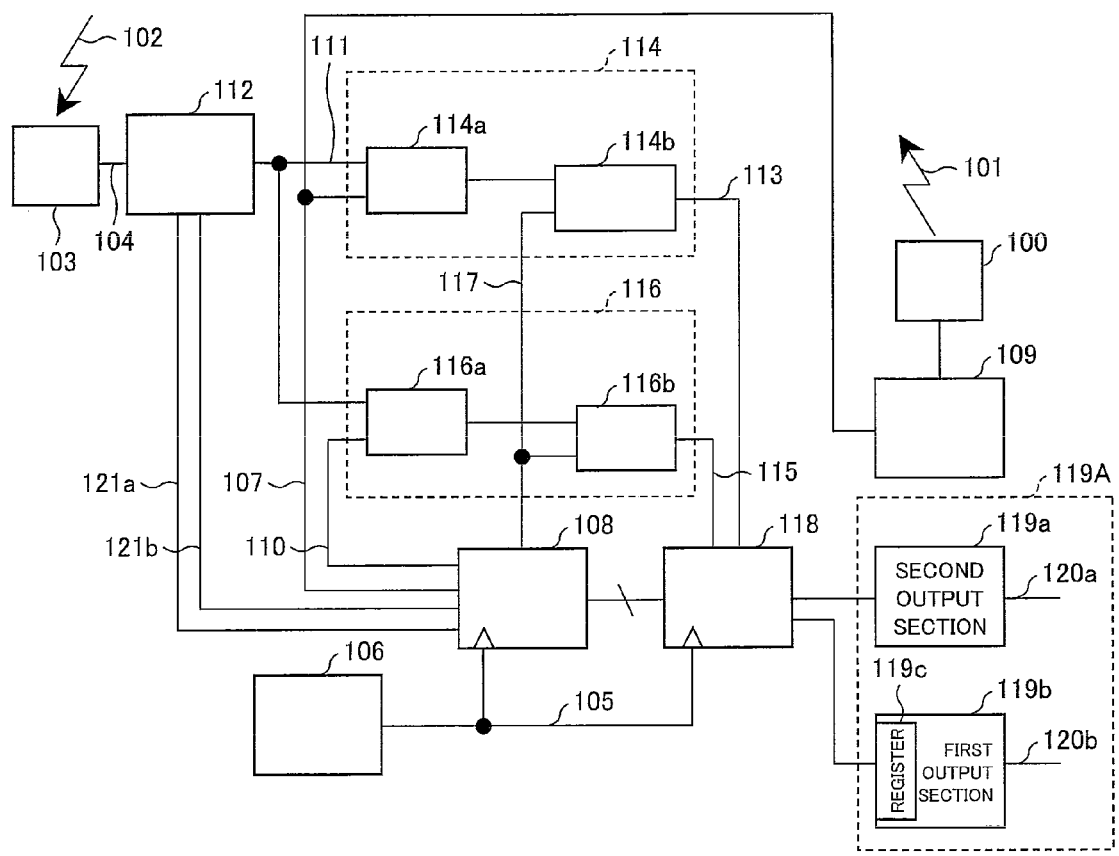
FIG. 9 is a block diagram showing an arrangement of substantial parts of the optical modulation-type detection device, especially another arrangement of the external output section.
Figure 10:
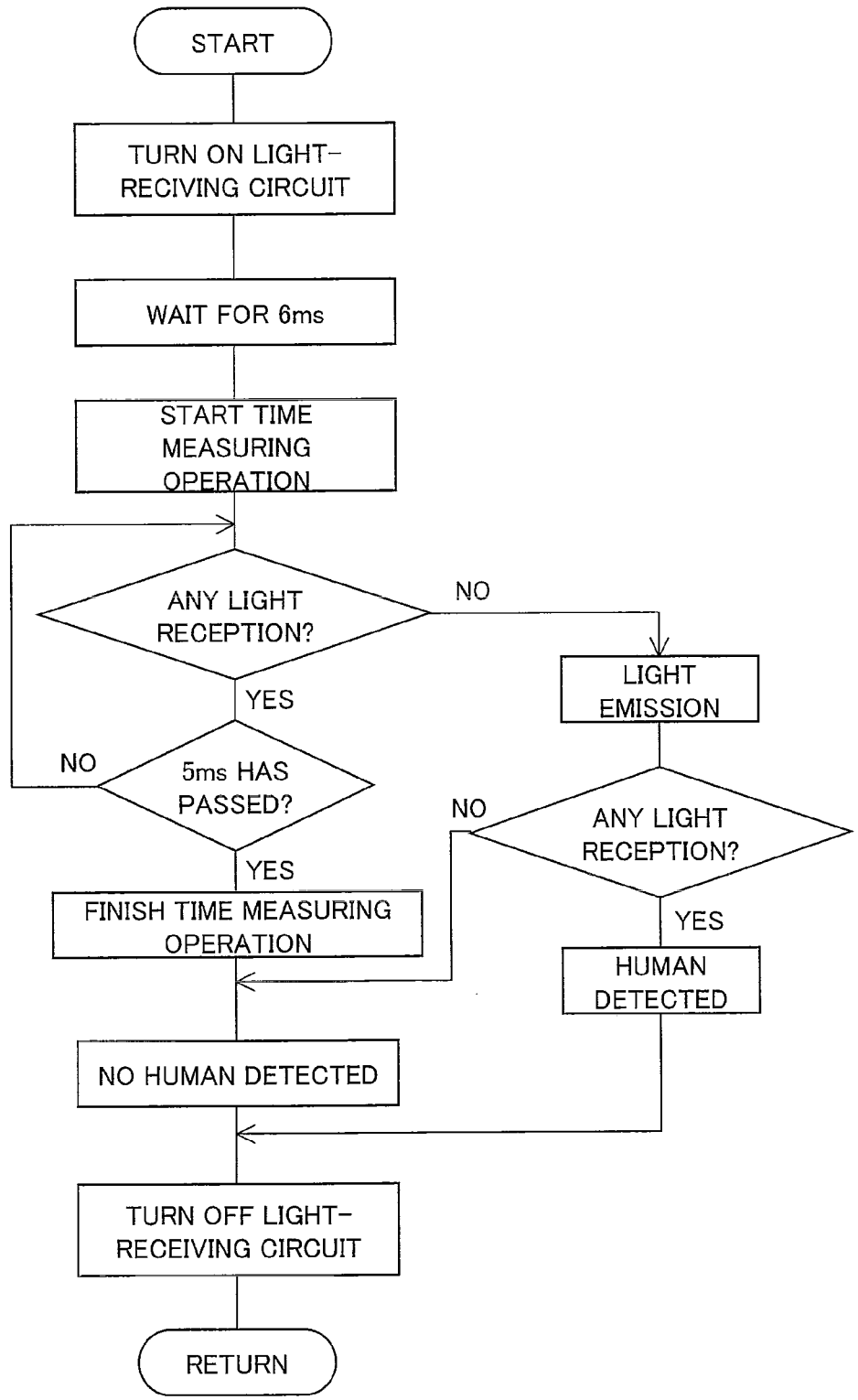
FIG. 10 is a flowchart showing how a conventional object detection device operates.
Figure 11:
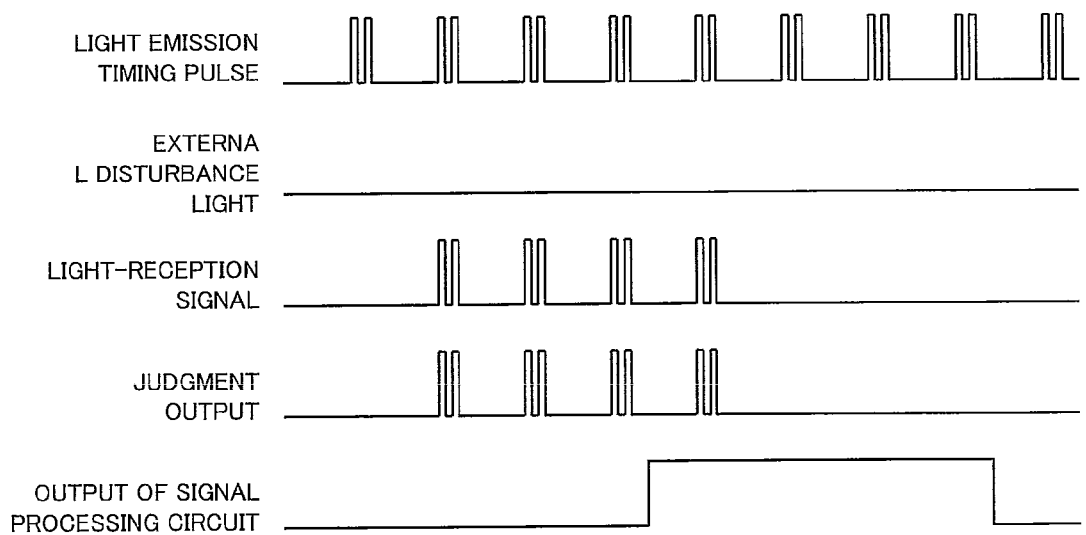
FIG. 11 is a timing chart showing how a conventional pulse modulation-type light detection device operates.

The external output section 119 can be arranged as follows. FIG. 9 is a block diagram showing an arrangement of a substantial part of the optical modulation-type detection device 150. Especially, FIG. 9 shows an arrangement of an external output section 119A which is a modification of the external output section 119.

The external output section 119A includes a first output section 119b and a second output section 119a. The first output section 119b includes a register 119c for storing a result determined by the judging section 118 as to whether or not a reflecting object is present, and buffers a registered value of the register 119c. The second output section 119a generates a leading edge 120a to the outside only in a case where the result determined by the judging section 118 is changed. The second output section 119a is externally cleared (reset) after the leading edge 120a is generated. The second output section 119a generates a trailing edge 120b in sync with the clearing of the second output section 119a. A transition occurs to a noise detection mode in the optical modulation-type detection device 150 while the registered value of the register 119c is being held. For example, the second output section 119a can be externally cleared by an arrangement in which the second output section 119a is realized by a bidirectional I/O which allows both inputting and outputting.

In a case where the external output section 119 is arranged like the external output section 119A, the optical modulation-type detection device 150 can have a function of carrying out an output in a so-called level sense type interruption mode. Especially, in a case where the result determined during the first period by the judging section 118 is updated too fast so that the updating is recognized as chattering by a system, it is possible to optimize a response operation by prolonging a read-out cycle of the system with the use of the interruption mode. This also has a beneficial effect on a reduction in power consumption of the whole system.

Further, it is preferable that the optical modulation-type detection device 150 includes an integrated circuit in which components other than the light-emitting element 100 are monolithically integrated. This causes (i) a reduction in power consumption without sacrificing detection sensitivity and response characteristics and (ii) a reduction in size without increasing a circuit size, thereby resulting in a reduction in mounting area. It is therefore possible to suppress an increase in production cost for the optical modulation-type detection device 150.

Since the optical modulation-type detection device 150 allows a reduction in power consumption without sacrificing detection sensitivity and response characteristics and allows a reduction in size without increasing a circuit size, the optical modulation-type detection device 150 can be suitably applied as (i) a detection device which detects presence or absence of an object by projecting pulsed light toward an automatic door, an automatic cleaning device for use in a sanitary apparatus, or an amusement machine and then detecting light reflected from the object, or (ii) a proximity sensor which detects presence or absence of an object coming close to a portable apparatus such as a portable phone or a media player. In this case, it is possible to produce, at a lower cost the devices to which the optical modulation-type detection device 150 is applied. In addition, in a case where functions of a plurality of object detection sensors having respective different specifications are integrated with each other or a function of an object detection sensor is integrated with a function of a different sensor such as illuminance sensor or RGB sensor), so as to be modularized as a single detection device, it is possible to realize provision of such a single detection device in a portable apparatus.

An optical modulation-type detection device of the present invention in which pulsed light is emitted from a light-emitting element toward an object to be detected, light which is reflected from or transmits through the object is received by a light-receiving element, and presence or absence of an object is detected in accordance with a light-reception signal supplied from the light-receiving element, said device includes: a pulse signal converting section which converts the light-reception signal into a pulse signal, and cuts off a light-reception signal pathway so as to suppress an offset of the pulse signal converting section; and a detection section which detects in accordance with the pulse signal (i) whether or not a first state occurs in which the light-reception signal is present during a period in which the pulsed light is not being emitted and (ii) whether or not a second state occurs in which the light-reception signal is present during a period in which the pulsed light is being emitted, the optical modulation-type detection device having operation modes including: a first operation mode having (i) a first period in which (a) the light-reception signal pathway of the pulse signal converting section is cut off so that the offset of the pulse signal converting section is suppressed and (b) the light-reception signal pathway of the pulse signal converting section is reconnected while a state in which the offset is suppressed is being maintained, at an end of the first period, and (ii) a second period in which whether or not the first state occurs is detected after the first period, and a second operation mode having at least a third period in which whether or not the second state occurs is detected after the first period is not detected in the first operation mode.

As described above, in a case where high integration, in which analog and digital elements are mixed, is intended by use of a fine CMOS process so as to realize a compact detection device, an offset voltage generated in the integrated circuit due to variations in the elements of the integrated circuit becomes a principal factor which causes a large deterioration in sensitivity of the detection device. However, an arrangement for suppressing the offset voltage is generally a stationary state (full-time connection), and therefore requires a large phase compensation capacity, thereby causing a large circuit size.

In contrast, the optical modulation-type detection device of the present invention causes the pulse signal converting section to cut off a pathway for amplifying a light-reception signal, thereby making it possible to correctly carry out offset canceling of a circuit itself under any external disturbance light circumstances. Further, a point at which the pathway is cut off is biased to be a low impedance. This makes it possible to stably perform signal amplification without generating an excessive transient voltage in a case where the pathway for amplifying the signal is reconnected and returns to normal state after the offset canceling period is completed.

The arrangement eliminates the need for an arrangement in which offset canceling is continuously carried out so that a large phase compensation capacity is required, and makes it possible to drive the light-emitting element after searching a state in which no influence of external disturbance light exists while continuously suppressing an offset of the pulse signal converting section. This makes it possible to detect presence or absence of an object in a high-sensitivity state. As such, it is possible to improve sensitivity and prevent malfunction of the optical modulation-type detection device without causing an increase in circuit size and bias current.

It is thus possible (i) to realize a reduction in power consumption without sacrificing detection sensitivity and response characteristics required for a detection device, and (ii) to realize a reduction in size of the device without increasing a circuit size.

In the optical modulation-type detection device of the present invention, it is preferable that the second operation mode further includes a first period.

According to the arrangement, the second operation mode includes the first period. This makes it possible to detect presence or absence of an object with higher sensitivity, as compared with a case where the second operation mode does not include the first period. Specifically, the first period is arranged in the second operation mode so that the first period comes before the third period.

In the optical modulation-type detection device of the present invention, it is preferable that the second operation mode further includes a second period.

According to the arrangement, the second operation mode includes the second period. This allows the optical modulation-type detection device to detect presence or absence of an object (i) with less affected by more complicated temporal change in external disturbance light level, and (ii) with having less malfunction, as compared with a case where the second operation mode does not include the second period. Specifically, the first period is arranged in the second operation mode so that the second period comes after the third period.

In the optical modulation-type detection device of the present invention, it is preferable that the second operation mode further includes a first period and a second period.

According to the arrangement, the second operation mode includes the first period and the second period. This allows the optical modulation-type detection device to detect presence or absence of an object (i) with less affected by more complicated temporal change in external disturbance light level, (ii) with having less malfunction, and (iii) with higher sensitivity, as compared with a case where the second operation mode does not include the first period and the second period.

Specifically, the first period is arranged in the second operation mode (i) so that the first period comes before the third period and the second period comes after the third period or (ii) so that the first period comes before and after the third period and the second period comes after the first period which follows the third period.

As described above, in the second operation mode, various patterns such as (i) the first period and the third period, (ii) the second period and the third period, and (iii) the first period, the second period, and the third period are available. Thus, high design freedom is secured.

It is preferable that the optical modulation-type detection device, further includes: a judging section which judges whether the object is present or not based on a detected result of the detection section, wherein: a first cycle which starts in sync with a start of the first operation mode is provided, in the first operation mode, a transition to the second operation mode occurs in a case where the first state is not detected in the second period during the first cycle, whereas a transition to the first period occurs in a case where the first state is detected during the first cycle, in the second operation mode, it is determined that the object is present in a case where the second state is detected consecutively n times (n is a natural number) in the third period during the first cycle by which the first operation mode is followed, whereas it is determined that the object is not present in a case where the second state is not detected consecutively n times, the detection section is reset to a non-detection state at an end of the second operation mode after the second period or before and after the second period, a transition to the first operation mode occurs in sync with an end of the first cycle.

According to the arrangement, in the second operation mode, (i) the second period is not provided and (ii) the third period is repeated before a change in external disturbance light noise level. This allows an improvement in reliability of a detected result.

A time period during which a state obtained at the time of completion of offset suppression can be maintained within an allowable range is limited. However, with the arrangement, it is possible to set an upper limit to a time interval between the first period and the second period or between the first period and the third period regardless of the type of operation modes. Consequently, it is possible to continue a normal operation even in a case of a complicated change in external disturbance light noise level while repeating the first operation mode and the second operation mode at a constant cycle.

It is preferable that the optical modulation-type detection device, further includes: a judging section which judges whether the object is present or not based on a detected result of the detection section, wherein: a first cycle starts in sync with a start of the first operation mode, in the first cycle of the first operation mode, (i) a transition to the second operation mode occurs in a case where the first state is not detected during the second period, and (ii) a transition to the first period occurs in a case where the first state is detected during the second period, in the second operation mode which includes the second period following the third period, in a state in which it is determined that no object is present, it is determined that the object is present in a case where the second state is detected n times (n is a natural number) consecutively in the third period during the first cycle which starts in sync with the start of the first operation mode and in a case where the first state is not detected n times consecutively in the second period, whereas, in a state in which it is determined that the object is present, it is determined that the object is present in a case where the second state is detected n times consecutively in the third period during the first cycle which starts in sync with the start of the first operation mode, the detection section is reset to a non-detection state (i) at an end of the second operation mode and (ii) after the second period or before and after the second period, a transition to the first operation mode occurs in sync with an end of the first cycle.

According to the arrangement, the second period is arranged in the second operation mode so that the second period comes after the third period, and the second and third periods are paired and observed. Even in a case where not only a low frequency drift but also a sudden increase occurs in an external disturbance light noise level, it is possible for the first operation mode to be carried out again, while the last determined result is being held, so that the timing suitable for the third period is searched again. This makes it possible to more effectively prevent malfunction.

Further, it is possible to set an algorithmic hysteresis based on the fact that a light-reception signal derived from the external disturbance light cannot have a negative value in a case where (i) a condition under which it is determined that a transition occurs from a "reflecting object is present" state to a "no reflecting object is present" state and (ii) a condition under which it is determined that a transition occurs from a "no reflecting object is present" state to a "reflecting object is present" state occurs are made asymmetrical to each other. Consequently, it is possible to more effectively prevent malfunction.

A time period during which a state obtained at the time of completion of offset suppression can be maintained within an allowable range is limited. However, with the arrangement, it is possible to set an upper limit to a time interval between the first period and the second period or between the first period and the third period regardless of the type of operation modes. Consequently, Consequently, it is possible to continue a normal operation even in a case of a complicated change in external disturbance light noise level while repeating the first operation mode and the second operation mode at a constant cycle.

It is preferable that the optical modulation-type detection device further includes an external output section which outputs, to an outside, a result determined by the judging section as to whether the object is present or not, wherein: the optical modulation-type detection device includes a start-up mode in which the detection section is reset to a non-detection state in sync with a start-up of the optical modulation-type detection device, the judging section determines in response to resetting of the detection section that no object is present, and then the external output section outputs the result determined by the judging section to the outside.

With the arrangement, the detection section is reset to a non-detection state in sync with the startup of the optical modulation-type detection device. This makes it possible to prevent each section from not performing a desired operation since. Furthermore, the external output section outputs to the outside a result of determining that the object is absent, and then updates and outputs a determined result in accordance with a change of state. This causes the detection device to appear to respond more naturally and appropriately.

In the optical modulation-type detection device, it is preferable that the optical modulation-type detection device includes a suspending mode in which each supply of (i) a first pulse signal used in driving the light-emitting element, (ii) a second pulse signal serving as a gate signal for suppressing an offset of the pulse signal converting section, (iii) a third pulse signal serving as a gate signal of the detection section in the second period, and (iv) a fourth pulse signal serving as a reset signal causing the detection section to be reset is suspended until the first cycle ends after it is determined that the object is present.

The arrangement allows a further reduction in time-averaged electric current consumption of the optical modulation-type detection device since unnecessary operation are not carried out.

In the optical modulation-type detection device of the present invention, it is preferable that, in the suspending mode, (i) the each supply of the first pulse signal, the second pulse signal, the third pulse signal, and the fourth pulse signal is suspended and (ii) power supply to at least part of a light-emitting element driving section for driving the light-emitting element and the pulse signal converting section is suspended so that an intermittent shutdown is carried out.

The arrangement allows a further reduction in time-averaged electric current consumption of the optical modulation-type detection device since unnecessary operation are not carried out.

In the optical modulation-type detection device of the present invention, it is preferable that the first cycle is half or more than half of a period of a commercial power supply.

The arrangement makes it possible to surely search a period in which the third period can be carried out with high sensitivity without being affected by an inverter fluorescent light since the first cycle is set to be half or more than half of a period of a commercial power source and to be substantially the same as or longer than a cycle of an envelope of light intensity of an inverter fluorescent light while the first period and the second period are carried out (continuously repeated) in at least the first operation mode.

In the optical modulation-type detection device of the present invention, it is preferable that the first cycle is variable.

According to the arrangement, in a case where the first cycle is set to be long, a frequency of update of determining presence or absence of an object decreases, but instead, (i) unnecessary light emission is avoided and (ii) there is an increase in percentage of a period during which unnecessary light emission is prevented. This allows a large reduction in time-averaged electric current consumption of the optical modulation-type detection device. Moreover, it is useful to cause the first cycle to be variable. This is because response time required for a detection device can be adjusted to the one which the user wishes to have. These effects can be obtained without affecting a circuit size, sensitivity of the detection device, and resistance to external disturbance light.

In the optical modulation-type detection device of the present invention, it is preferable that a transition to the second operation mode occurs in a case where a transition to the first operation mode occurs after it is determined that the object is present, regardless of a detected result obtained in the second period via the first period.

With the arrangement, it is possible to avoid a state in which a transition to the second operation mode cannot occur, even under a unique situation in which extraordinary increase in light-emitting signal due to external disturbance light and the like occurs in a state in which it is once determined that an object is present.

In the optical modulation-type detection device of the present invention, it is preferable that the pulse signal converting section has hysteresis property, and in a case where it is determined that the object is present, the hysteresis is set to be smaller as compared to a case where it is determined that the object is not present.

With the arrangement, it is possible to add an algorithmic hysteresis which varies depending on a detection state in a relatively long time scale to normal hysteresis which is inherent in the pulse signal converting section and which causes the pulse signal converting section to operate in a time scale equivalent to a pulse width. As such, it is possible to prevent malfunction without causing a large increase in circuit size and electric current consumption.

In the optical modulation-type detection device of the present invention, it is preferable that a first pulse width of a third pulse signal serving as a gate signal of the detection section during the second period in the first operation mode is equal to a second pulse width of the third pulse signal in the second operation mode.

With the arrangement, the pulse signals having the respective first and second pulse widths serve as equivalent gate signals with respect to external disturbance light including a specific frequency component. That is, even if something bad occurs to the frequency response characteristic of the pulse signal converting section, a result of the second period can be always obtained in the same manner regardless of operation modes. This makes it possible to avoid a situation in which a desired detection cannot be carried out because sensitivity and/or response in the second period vary depending on (i) operation modes and (ii) conditions for determining the transition of the operation modes.

In the optical modulation-type detection device of the present invention, it is preferable that each of the first pulse width and the second pulse width is set to be longer than an inverse of a frequency at which a light intensity becomes highest among frequency components of a main external disturbance light components under a circumstance where the optical modulation-type detection device is supposed to be used.

With the arrangement, it is possible to more effectively carry out asynchronous reception with respect to frequency components of external disturbance light noise which has no relationship with the operation of the optical modulation-type detection device.

In the optical modulation-type detection device of the present invention, it is preferable that the optical modulation-type detection device further includes a continuous shutdown mode in which power supply to all of components constituting the optical modulation-type detection device is stopped, and a transition from each of the operation modes other than the continuous shutdown mode and each of the first through third periods to the continuous shutdown mode occurs in a state in which (i) none of (a) a first pulse signal used in driving the light-emitting element, (b) a second pulse signal serving as a gate signal for suppressing an offset of the pulse signal converting section, (c) a third pulse signal serving as a gate signal of the detection section in the second period, and (d) a fourth pulse signal serving as a reset signal for resetting the detection section is supplied, and (ii) the light-reception signal path of the pulse signal converting section is cut off.

With the arrangement, it is possible to surely prevent a situation in which a shutdown operation is externally carried out independently of the operations of the optical modulation-type detection device during the first period, during transition to the first period, or during transition to each of the operation mode and the period other than the continuous shutdown mode so that a pass through current which flows from a power source to ground is generated.

In the optical modulation-type detection device of the present invention, it is preferable that the external output section includes: a register in which a result, determined by the judgment section as to whether or not the object is present, is stored; a first output section which buffers the result thus stored in the register; and a second output section which (i) generates a leading edge and outputs the leading edge to an outside only in a case where the result is altered, (ii) is subjected to external reset after the leading edge is generated, and (iii) generates a trailing edge in response to the external reset, and the optical modulation-type detection device shifts to the first operation mode while the result is being stored in the register.

According to the above arrangement, the optical modulation-type detection device can have a function of carrying out an output in a so-called level sense type interruption mode. Especially, in a case where the result determined during the first cycle by the judging section is updated too fast so that the updating is recognized as chattering by a system, it is possible to optimize a response operation by prolonging a read-out cycle of the system with the use of the interruption mode. This also has a beneficial effect on a reduction in power consumption of the whole system.

In the optical modulation-type detection device of the present invention, it is preferable that components other than the light-emitting element are monolithically integrated in an integrated circuit.

This causes (i) a reduction in power consumption without sacrificing detection sensitivity and response characteristics and (ii) a reduction in size without increasing a circuit size, thereby resulting in a reduction in mounting area. It is therefore possible to suppress an increase in production cost for the optical modulation-type detection device.

In order to attain the object of the present invention, an electronic device of the present invention includes the optical modulation-type detection device.

According to the arrangement, the electronic device of the present invention includes the optical modulation-type detection device which causes (i) a reduction in power consumption without sacrificing detection sensitivity and response characteristics and (ii) a reduction in size without increasing a circuit size, thereby resulting in a reduction in mounting area. Therefore, in a case where functions of a plurality of object detection sensors having respective different specifications are integrated with each other or a function of an object detection sensor is integrated with a function of a different sensor such as illuminance sensor or RGB sensor, so as to be modularized as a single detection device, it is possible to realize provision of such a single detection device in a portable apparatus.

The present invention is not limited to the description of the embodiments above, but may be altered by a skilled person within the scope of the claims. An embodiment based on a proper combination of technical means disclosed in different embodiments is encompassed in the technical scope of the present invention.

The invention claimed is:

1. An optical modulation-type detection device in which pulsed light is emitted from a light-emitting element toward an object to be detected, light which is reflected from or transmits through the object is received by a light-receiving element, and presence or absence of an object is detected in accordance with a light-reception signal supplied from the light-receiving element, said device comprising:
a pulse signal converting section which converts the light-reception signal into a pulse signal, and cuts off a light-reception signal pathway so as to suppress an offset of the pulse signal converting section; and
a detection section which detects in accordance with the pulse signal (i) whether or not a first state occurs in which the light-reception signal is present during a period in which the pulsed light is not being emitted and (ii) whether or not a second state occurs in which the light-reception signal is present during a period in which the pulsed light is being emitted,
the optical modulation-type detection device having operation modes including:
a first operation mode having (i) a first period in which (a) the light-reception signal pathway of the pulse signal converting section is cut off so that the offset of the pulse signal converting section is suppressed and (b) the light-reception signal pathway of the pulse signal converting section is reconnected while a state in which the offset is suppressed is being maintained, at an end of the first period, and (ii) a second period in which whether or not the first state occurs is detected after the first period, and
a second operation mode having at least a third period in which whether or not the second state occurs is detected after the first period is not detected in the first operation mode.

2. The optical modulation-type detection device according to claim 1, wherein
the second operation mode further includes a first period.

3. The optical modulation-type detection device according to claim 1, wherein
the second operation mode further includes a second period.

4. The optical modulation-type detection device according to claim 3, further comprising:

a judging section which judges whether the object is present or not based on a detected result of the detection section, wherein:

a first cycle starts in sync with a start of the first operation mode, in the first cycle of the first operation mode, (i) a transition to the second operation mode occurs in a case where the first state is not detected during the second period, and (ii) a transition to the first period occurs in a case where the first state is detected during the second period, in the second operation mode which includes the second period following the third period, in a state in which it is determined that no object is present, it is determined that the object is present in a case where the second state is detected n times (n is a natural number) consecutively in the third period during the first cycle which starts in sync with the start of the first operation mode and in a case where the first state is not detected n times consecutively in the second period, whereas, in a state in which it is determined that the object is present, it is determined that the object is present in a case where the second state is detected n times consecutively in the third period during the first cycle which starts in sync with the start of the first operation mode, the detection section is reset to a non-detection state (i) at an end of the second operation mode and (ii) after the second period or before and after the second period, a transition to the first operation mode occurs in sync with an end of the first cycle.

5. The optical modulation-type detection device according to claim 4, further comprising an external output section which outputs, to an outside, a result determined by the judging section as to whether the object is present or not, wherein:

the optical modulation-type detection device includes a start-up mode in which the detection section is reset to a non-detection state in sync with a start-up of the optical modulation-type detection device, the judging section determines in response to resetting of the detection section that no object is present, and then the external output section outputs the result determined by the judging section to the outside.

6. The optical modulation-type detection device according to claim 5, wherein:

the external output section includes a register in which a result, determined by the judgment section as to whether or not the object is present, is stored;

a first output section which buffers the result thus stored in the register; and a second output section which (i) generates a leading edge and outputs the leading edge to an outside only in a case where the result is altered, (ii) is subjected to external reset after the leading edge is generated, and (iii) generates a trailing edge in response to the external reset, and the optical modulation-type detection device shifts to the first operation mode while the result is being stored in the register.

7. The optical modulation-type detection device according to claim 4, wherein the optical modulation-type detection device includes a suspending mode in which each supply of (i) a first pulse signal used in driving the light-emitting element, (ii) a second pulse signal serving as a gate signal for suppressing an offset of the pulse signal converting section, (iii) a third pulse signal serving as a gate signal of the detection section in the second period, and (iv) a fourth pulse signal serving as a reset signal causing the detection section to be reset is suspended until the first cycle ends after it is determined that the object is present.

8. The optical modulation-type detection device according to claim 7, wherein in the suspending mode, (i) the each supply of the first pulse signal, the second pulse signal, the third pulse signal, and the fourth pulse signal is suspended and (ii) power supply to at least part of a light-emitting element driving section for driving the light-emitting element and the pulse signal converting section is suspended so that an intermittent shutdown is carried out.

9. The optical modulation-type detection device according to claim 4, wherein the first cycle is half or more than half of a period of a commercial power supply.

10. The optical modulation-type detection device according to claim 4, wherein the first cycle is variable.

11. The optical modulation-type detection device according to claim 4, wherein a transition to the second operation mode occurs in a case where a transition to the first operation mode occurs after it is determined that the object is present, regardless of a detected result obtained in the second period via the first period.

12. The optical modulation-type detection device according to claim 4, wherein the pulse signal converting section has hysteresis property, and in a case where it is determined that the object is present, the hysteresis is set to be smaller as compared to a case where it is determined that the object is not present.

13. The optical modulation-type detection device according to claim 4, wherein a first pulse width of a third pulse signal serving as a gate signal of the detection section during the second period in the first operation mode is equal to a second pulse width of the third pulse signal in the second operation mode.

14. The optical modulation-type detection device according to claim 13, wherein each of the first pulse width and the second pulse width is set to be longer than an inverse of a frequency at which a light intensity becomes highest among frequency components of a main external disturbance light components under a circumstance where the optical modulation-type detection device is supposed to be used.

15. The optical modulation-type detection device according to claim 1, wherein the second operation mode further includes a first period and a second period.

16. The optical modulation-type detection device according to claim 15, further comprising:

a judging section which judges whether the object is present or not based on a detected result of the detection section, wherein:

a first cycle starts in sync with a start of the first operation mode, in the first cycle of the first operation mode, (i) a transition to the second operation mode occurs in a case where the first state is not detected during the second period, and (ii) a transition to the first period occurs in a case where the first state is detected during the second period, in the second operation mode which includes the second period following the third period, in a state in which it is determined that no object is present, it is determined that the object is present in a case where the second state is detected n times (n is a natural number) consecutively in the third period during the first cycle which starts in sync with the start of the first operation mode and in a case where the first state is not detected n times consecutively in the second period, whereas, in a state in which it is determined that the object is present, it is determined that the object is present in a case where the second state is detected n times consecutively in the third period during the first cycle which starts in sync with the start of the first operation mode, the detection section is reset to a non-detection state (i) at an end of the second operation mode and (ii) after the second period or before and after the second period, a transition to the first operation mode occurs in sync with an end of the first cycle.

17. The optical modulation-type detection device according to claim 16, further comprising an external output section which outputs, to an outside, a result determined by the judging section as to whether the object is present or not, wherein:

the optical modulation-type detection device includes a start-up mode in which the detection section is reset to a non-detection state in sync with a start-up of the optical modulation-type detection device, the judging section determines in response to resetting of the detection section that no object is present, and then the external output section outputs the result determined by the judging section to the outside.

18. The optical modulation-type detection device according to claim 17, wherein:

the external output section includes a register in which a result, determined by the judgment section as to whether or not the object is present, is stored;

a first output section which buffers the result thus stored in the register; and a second output section which (i) generates a leading edge and outputs the leading edge to an outside only in a case where the result is altered, (ii) is subjected to external reset after the leading edge is generated, and (iii) generates a trailing edge in response to the external reset, and the optical modulation-type detection device shifts to the first operation mode while the result is being stored in the register.

19. The optical modulation-type detection device according to claim 16, wherein the optical modulation-type detection device includes a suspending mode in which each supply of (i) a first pulse signal used in driving the light-emitting element, (ii) a second pulse signal serving as a gate signal for suppressing an offset of the pulse signal converting section, (iii) a third pulse signal serving as a gate signal of the detection section in the second period, and (iv) a fourth pulse signal serving as a reset signal causing the detection section to be reset is suspended until the first cycle ends after it is determined that the object is present.

20. The optical modulation-type detection device according to claim 19, wherein in the suspending mode, (i) the each supply of the first pulse signal, the second pulse signal, the third pulse signal, and the fourth pulse signal is suspended and (ii) power supply to at least part of a light-emitting element driving section for driving the light-emitting element and the pulse signal converting section is suspended so that an intermittent shutdown is carried out.

21. The optical modulation-type detection device according to claim 16, wherein the first cycle is half or more than half of a period of a commercial power supply.

22. The optical modulation-type detection device according to claim 16, wherein the first cycle is variable.

23. The optical modulation-type detection device according to claim 16, wherein a transition to the second operation mode occurs in a case where a transition to the first operation mode occurs after it is determined that the object is present, regardless of a detected result obtained in the second period via the first period.

24. The optical modulation-type detection device according to claim 16, wherein the pulse signal converting section has hysteresis property, and in a case where it is determined that the object is present, the hysteresis is set to be smaller as compared to a case where it is determined that the object is not present.

25. The optical modulation-type detection device according to claim 16, wherein a first pulse width of a third pulse signal serving as a gate signal of the detection section during the second period in the first operation mode is equal to a second pulse width of the third pulse signal in the second operation mode.

26. The optical modulation-type detection device according to claim 25, wherein each of the first pulse width and the second pulse width is set to be longer than an inverse of a frequency at which a light intensity becomes highest among frequency components of a main external disturbance light components under a circumstance where the optical modulation-type detection device is supposed to be used.

27. The optical modulation-type detection device according to claim 1, further comprising:

a judging section which judges whether the object is present or not based on a detected result of the detection section, wherein:

a first cycle which starts in sync with a start of the first operation mode is provided, in the first operation mode, a transition to the second operation mode occurs in a case where the first state is not detected in the second period during the first cycle, whereas a transition to the first period occurs in a case where the first state is detected during the first cycle, in the second operation mode, it is determined that the object is present in a case where the second state is detected consecutively n times (n is a natural number) in the third period during the first cycle by which the first operation mode is followed, whereas it is determined that the object is not present in a case where the second state is not detected consecutively n times, the detection section is reset to a non-detection state at an end of the second operation mode after the second period or before and after the second period, a transition to the first operation mode occurs in sync with an end of the first cycle.

28. The optical modulation-type detection device according to claim 27, further comprising an external output section which outputs, to an outside, a result determined by the judging section as to whether the object is present or not, wherein:

the optical modulation-type detection device includes a start-up mode in which the detection section is reset to a non-detection state in sync with a start-up of the optical modulation-type detection device, the judging section determines in response to resetting of the detection section that no object is present, and then the external output section outputs the result determined by the judging section to the outside.

29. The optical modulation-type detection device according to claim 28, wherein:
the external output section includes:
a register in which a result, determined by the judgment section as to whether or not the object is present, is stored;
a first output section which buffers the result thus stored in the register; and
a second output section which (i) generates a leading edge and outputs the leading edge to an outside only in a case where the result is altered, (ii) is subjected to external reset after the leading edge is generated, and (iii) generates a trailing edge in response to the external reset, and
the optical modulation-type detection device shifts to the first operation mode while the result is being stored in the register.

30. The optical modulation-type detection device according to claim 27, wherein
the optical modulation-type detection device includes a suspending mode in which each supply of (i) a first pulse signal used in driving the light-emitting element, (ii) a second pulse signal serving as a gate signal for suppressing an offset of the pulse signal converting section, (iii) a third pulse signal serving as a gate signal of the detection section in the second period, and (iv) a fourth pulse signal serving as a reset signal causing the detection section to be reset is suspended until the first cycle ends after it is determined that the object is present.

31. The optical modulation-type detection device according to claim 30, wherein
in the suspending mode, (i) the each supply of the first pulse signal, the second pulse signal, the third pulse signal, and the fourth pulse signal is suspended and (ii) power supply to at least part of a light-emitting element driving section for driving the light-emitting element and the pulse signal converting section is suspended so that an intermittent shutdown is carried out.

32. The optical modulation-type detection device according to claim 27, wherein
the first cycle is half or more than half of a period of a commercial power supply.

33. The optical modulation-type detection device according to claim 27, wherein
the first cycle is variable.

34. The optical modulation-type detection device according to claim 27, wherein
a transition to the second operation mode occurs in a case where a transition to the first operation mode occurs after it is determined that the object is present, regardless of a detected result obtained in the second period via the first period.

35. The optical modulation-type detection device according to claim 27, wherein
the pulse signal converting section has hysteresis property, and
in a case where it is determined that the object is present, the hysteresis is set to be smaller as compared to a case where it is determined that the object is not present.

36. The optical modulation-type detection device according to claim 1, wherein:
the optical modulation-type detection device further includes a continuous shutdown mode in which power supply to all of components constituting the optical modulation-type detection device is stopped, and
a transition from each of the operation modes other than the continuous shutdown mode and each of the first through third periods to the continuous shutdown mode occurs in a state in which (i) none of (a) a first pulse signal used in driving the light-emitting element, (b) a second pulse signal serving as a gate signal for suppressing an offset of the pulse signal converting section, (c) a third pulse signal serving as a gate signal of the detection section in the second period, and (d) a fourth pulse signal serving as a reset signal for resetting the detection section is supplied, and (ii) the light-reception signal path of the pulse signal converting section is cut off.

37. The optical modulation-type detection device according to claim 1, wherein
components other than the light-emitting element are monolithically integrated in an integrated circuit.

38. An electronic device comprising the optical modulation-type detection device recited in claim 1.

* * * * *